United States Patent

Yoshimura et al.

(10) Patent No.: US 10,298,153 B2
(45) Date of Patent: May 21, 2019

(54) INPUT BUFFER, SEMICONDUCTOR DEVICE AND ENGINE CONTROL UNIT

(71) Applicant: Renesas Electronics Corporation, Tokyo (JP)

(72) Inventors: Naohiro Yoshimura, Tokyo (JP); Akihiro Nakahara, Tokyo (JP); Makoto Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 5 days.

(21) Appl. No.: 15/656,864

(22) Filed: Jul. 21, 2017

(65) Prior Publication Data

US 2018/0091068 A1  Mar. 29, 2018

(30) Foreign Application Priority Data

Sep. 28, 2016  (JP) .................. 2016-189594

(51) Int. Cl.
  *H02P 1/02*  (2006.01)
  *H02P 29/20*  (2016.01)
  *G01R 31/02*  (2006.01)

(52) U.S. Cl.
  CPC ............ *H02P 1/022* (2013.01); *G01R 31/028* (2013.01); *H02P 29/20* (2016.02)

(58) Field of Classification Search
  None
  See application file for complete search history.

(56) References Cited

U.S. PATENT DOCUMENTS

| 2003/0196140 A1 | 10/2003 | Kurosawa |
| 2005/0206347 A1* | 9/2005 | Seo ............ B60L 3/0046 320/150 |
| 2013/0162197 A1* | 6/2013 | Takahashi ......... H02J 7/0073 320/107 |
| 2014/0320155 A1* | 10/2014 | Durston ........... G01R 31/028 324/750.3 |

FOREIGN PATENT DOCUMENTS

JP  2003-307544 A  10/2003

* cited by examiner

*Primary Examiner* — Eduardo Colon Santana
*Assistant Examiner* — Zemenay T Truneh
(74) *Attorney, Agent, or Firm* — McGinn IP Law Group, PLLC.

(57) ABSTRACT

Provided are an input buffer, a semiconductor device and an engine control unit making it possible to execute fault diagnosis in real time. The input buffer includes a first comparator which compares a voltage of an input signal with a first reference voltage, a hysteresis circuit which generates a first high voltage side or low voltage side reference voltage on the basis of a comparison result from the first comparator, a second comparator which compares the voltage of the input signal with a second reference voltage, and a hysteresis circuit which outputs a second high voltage side reference voltage which is higher than the first high voltage side reference voltage or a second low voltage side reference voltage which is lower than the first low voltage side reference voltage.

6 Claims, 18 Drawing Sheets

FIG. 4

| CIRCUIT | INPUT SIGNAL | INPUT THRESHOLD VALUE |
|---|---|---|
| COMPARATOR 111 | Lo (0V) | VIH1 (3V) |
|  | Hi (5V) | VIL1 (2V) |
| COMPARATOR 121 | Lo | VIH2 (3.1V) |
|  | Hi | VIL2 (1.9V) |

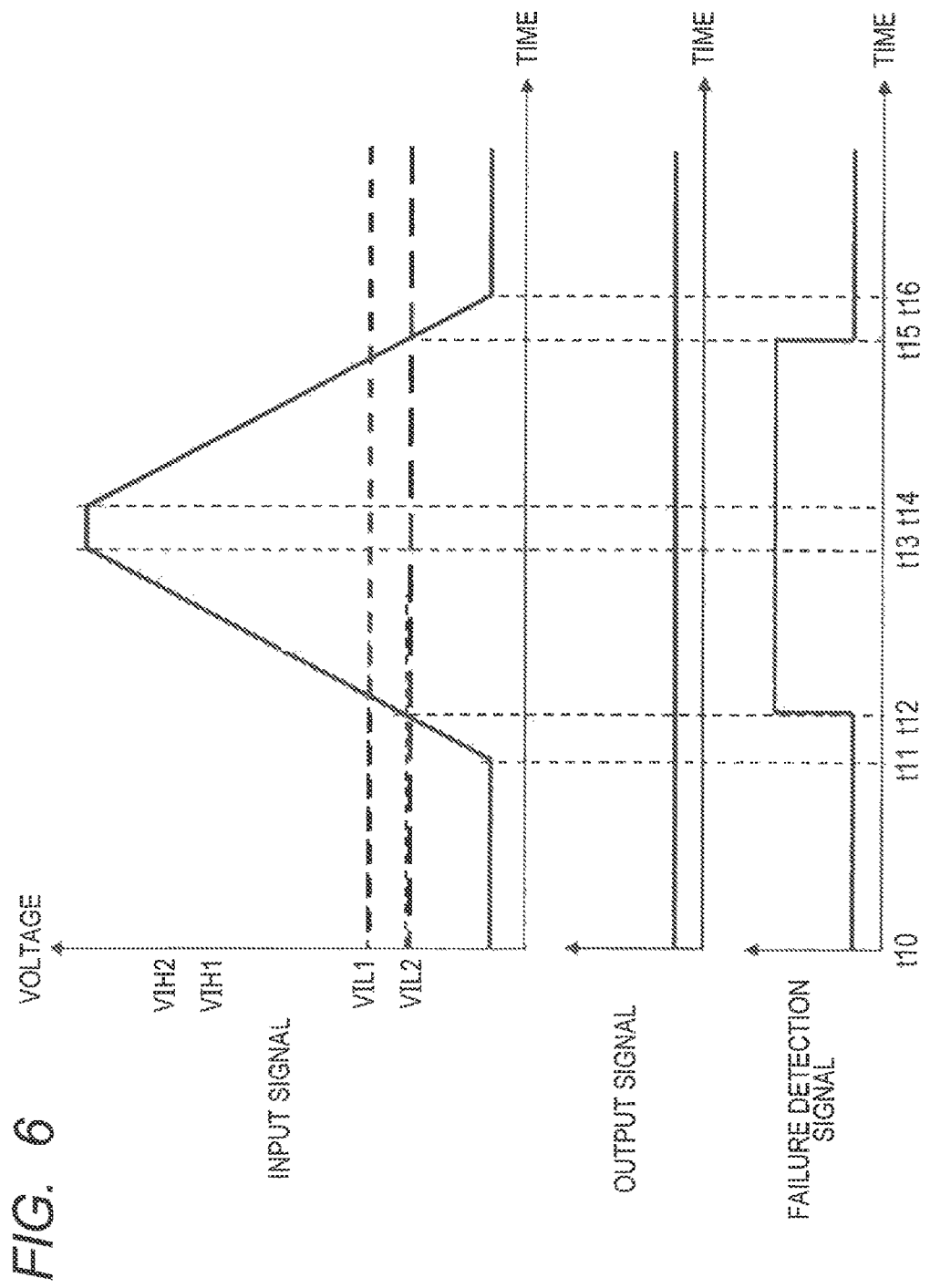

FIG. 7

| STATE | INPUT SIGNAL | COMPARATOR 111 OUTPUT | COMPARATOR 121 OUTPUT | OUTPUT SIGNAL | LOGIC | FAILURE DETECTION SIGNAL |
|---|---|---|---|---|---|---|
| IN NORMAL | Lo | Lo | Lo | Lo | NORMAL | Lo |
| | Hi | Hi | Hi | Hi | NORMAL | Lo |
| IN FAILURE | Lo | FIXED TO Lo | Lo | Lo | NORMAL | Lo |
| | Hi | FIXED TO Lo | Hi | Lo | ABNORMAL | Hi |
| | Lo | FIXED TO Hi | Lo | Hi | ABNORMAL | Hi |
| | Hi | FIXED TO Hi | Hi | Hi | NORMAL | Lo |
| | Lo | Lo | FIXED TO Lo | Lo | NORMAL | Lo |
| | Hi | Hi | FIXED TO Lo | Lo | ABNORMAL | Hi |
| | Lo | Lo | FIXED TO Hi | Lo | ABNORMAL | Hi |
| | Hi | Hi | FIXED TO Hi | Hi | NORMAL | Lo |

FIG. 12

| STATE | INPUT SIGNAL | OUTPUT SIGNAL | LOGIC | INPUT THRESHOLD VALUE |
|---|---|---|---|---|
| IN NORMAL | Lo (0V) | Lo | NORMAL | VIH (3V) |
|  | Hi (5V) | Hi | NORMAL | VIL (2V) |
| IN FAILURE | Lo | FIXED TO Lo | NORMAL | VIH |
|  | Hi |  | ABNORMAL | VIL |
|  | Lo | FIXED TO Hi | ABNORMAL | VIH |
|  | Hi |  | NORMAL | VIL |

FIG. 14

| CIRCUIT | INPUT SIGNAL | INPUT THRESHOLD VALUE |
|---|---|---|
| COMPARATOR 611 | Lo (0 V) | VIHA (IDEAL VALUE 3 V) |
|  | Hi (5 V) | VILA (IDEAL VALUE 2 V) |
| COMPARATOR 621 | Lo | VIHB (IDEAL VALUE 3 V) |
|  | Hi | VILB (IDEAL VALUE 2 V) |

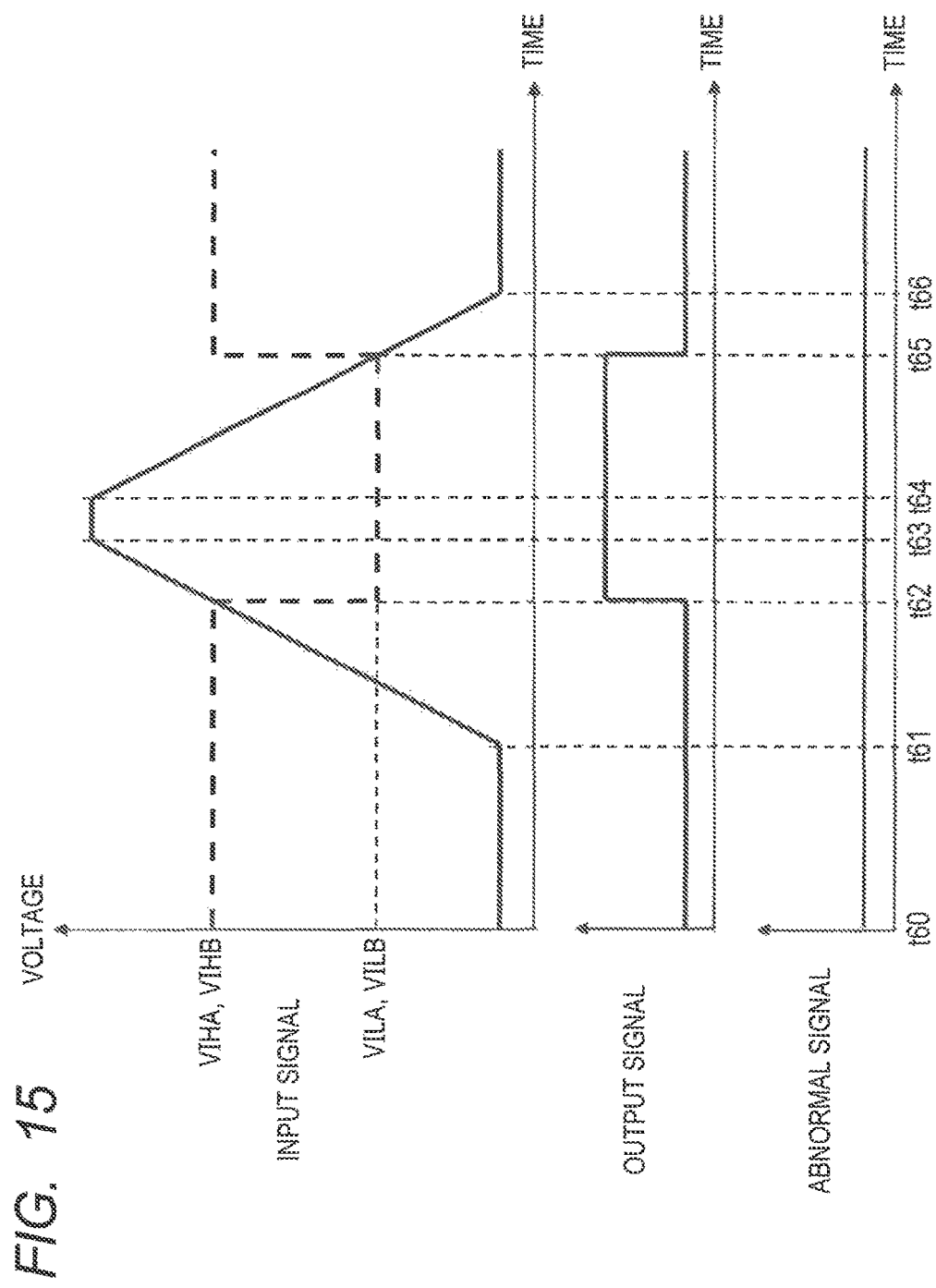

FIG. 16

| STATE | INPUT SIGNAL | COMPARATOR 611 OUTPUT | COMPARATOR 621 OUTPUT | OUTPUT SIGNAL | LOGIC | FAILURE DETECTION SIGNAL |
|---|---|---|---|---|---|---|
| IN NORMAL | Lo | Lo | Lo | Lo | NORMAL | Lo |
|  | Hi | Hi | Hi | Hi | NORMAL | Lo |
| IN FAILURE | Lo | FIXED TO Lo | Lo | Lo | NORMAL | Lo |
|  | Hi |  | Hi | Lo | ABNORMAL | Hi |
|  | Lo | FIXED TO Hi | Lo | Hi | ABNORMAL | Hi |
|  | Hi |  | Hi | Hi | NORMAL | Lo |
|  | Lo | Lo | FIXED TO Lo | Lo | NORMAL | Lo |
|  | Hi | Hi |  | Lo | ABNORMAL | Hi |
|  | Lo | Lo | FIXED TO Hi | Lo | ABNORMAL | Hi |
|  | Hi | Hi |  | Hi | NORMAL | Lo |

FIG. 17

| CIRCUIT | INPUT SIGNAL | INPUT THRESHOLD VALUE |
|---|---|---|
| COMPARATOR 611 | Lo (0V) | VIHA (ACTUAL VALUE 3 V) |
|  | Hi (5V) | VILA (ACTUAL VALUE 2 V) |
| COMPARATOR 621 | Lo | VIHB (ACTUAL VALUE 3.1 V) |
|  | Hi | VILB (ACTUAL VALUE 1.9 V) |

INPUT BUFFER, SEMICONDUCTOR DEVICE AND ENGINE CONTROL UNIT

CROSS-REFERENCE TO RELATED APPLICATIONS

The disclosure of Japanese Patent Application No. 2016-189594 filed on Sep. 28, 2016 including the specification, drawings and abstract is incorporated herein by reference in its entirety.

BACKGROUND

The present invention relates to an input buffer, a semiconductor device and an engine control unit and, for example, relates to the input buffer, the semiconductor device and the engine control unit suited to execute fault diagnosis in real time while suppressing misdetection of a fault.

An engine control unit (ECU) which controls an engine is loaded on a vehicle such as an automobile, a motor bicycle and so forth. The engine control unit includes, for example, a microcomputer which outputs a control signal in accordance with button operation by a driver and a semiconductor device for electric power control (hereinafter, referred to as the electric power control semiconductor device) which controls driving of an electric parking brake (EPB) on the basis of the control signal.

Here, it is requested to the electric power control semiconductor device to control driving of the electric parking brake without impairing safety performance. In particular, it is requested to the electric power control semiconductor device to drive the electric parking brake in the same manner as that in a normal state or, at least, to prevent sudden stopping and sudden starting of the vehicle (that is, to shift the vehicle to a failsafe operation) by bringing the electric parking brake into a non-driven state even in a case where the input buffer which receives the control signal from the microcomputer has failed.

For example, a configuration disclosed in Japanese Unexamined Patent Application Publication No. 2003-307544 is adapted to selectively operate any one of clocked inverters which are arranged in parallel and prevents stopping of an operation caused by a fault by switching the clocked inverter to be selected to another clocked inverter and operating it in a case where the fault of one clocked inverter which is being selected has been detected.

SUMMARY

In addition to the configuration disclosed in Japanese Unexamined Patent Application Publication No. 2003-307544, it is still requested to the electric power control semiconductor device to drive the electric parking brake in the same manner as that in the normal state or, at least, to shift the vehicle to the failsafe operation by bringing the electric parking brake into the non-driven state even in a case where the input buffer which receives the control signal from the microcomputer has failed.

Further, it is requested to the electric power control semiconductor device to have a function of accurately and quickly detecting the fault of the input buffer. Other matters to be solved and novel features of the preset invention will become apparent from the description of the present specification and the appended drawings.

The present invention has been made in view of the above mentioned circumstances. According to one embodiment of the present invention, there is provided an input buffer including a first comparator which compares a voltage of an input signal with a first reference voltage and outputs a first comparison result, a first reference voltage generation section which selects either a first high potential side voltage or a first low potential side voltage on the basis of the first comparison result and outputs the selected voltage as the first reference voltage, a second comparator which compares the voltage of the input signal with a second reference voltage and outputs a second comparison result, a second reference voltage generation section which selects either a second high potential side voltage which is higher than the first high potential side voltage or a second low potential side voltage which is lower than the first low potential side voltage and outputs the selected voltage as the second reference voltage, an output signal generation section which generates an output signal on the basis of the first and second comparison results, and a fault detection signal generation section which generates a fault detection signal indicating whether a fault has occurred in either the first comparator or the second comparator on the basis of the first and second comparison results.

According to another embodiment of the present invention, there is provide an input buffer including a first comparator which is provided in a semiconductor device which controls driving of an electric parking motor loaded on a vehicle, compares a voltage of an input signal with a first reference voltage and outputs a first comparison result, a first reference voltage generation section which selects either a first high potential side voltage or a first low potential side voltage on the basis of the first comparison result and outputs the selected voltage as the first reference voltage, a second comparator which compares the voltage of the input signal with a second reference voltage and outputs a second comparison result, a second reference voltage generation section which selects either a second high potential side voltage which is higher than the first high potential side voltage or a second low potential side voltage which is lower than the first low potential side voltage and outputs the selected voltage as the second reference voltage, an output signal generation section which generates an output signal on the basis of the first and second comparison results, and a fault detection signal generation section which generates a fault detection signal indicating whether a fault has occurred in either the first comparator or the second comparator on the basis of the first and second comparison results.

According to the above-mentioned one embodiment, it becomes possible to provide an input buffer, a semiconductor device and an engine control unit making it possible to execute fault diagnosis in real time while suppressing misdetection of the fault.

BRIEF DESCRIPTION OF THE DRAWINGS

FIG. 4 is a diagram illustrating one example of a relation between an input signal and an input threshold value of each of comparators provided in the input buffer illustrated in FIG. 3.

FIG. 6 is a timing chart illustrating one example of an operation in a failed state of the input buffer illustrated in FIG. 3.

FIG. 7 is a diagram illustrating one example of a relation among an input signal, an output signal and a fault detection signal of the input buffer illustrated in FIG. 3.

FIG. 12 is a diagram illustrating one example of a relation among each input signal, each input threshold value and each output signal of the input buffer illustrated in FIG. 11.

FIG. 14 is a diagram illustrating one example of a relation between an input signal and an ideal value of an input threshold value of each of comparators provided in the input buffer illustrated in FIG. 13.

FIG. 15 is a timing chart illustrating one example of an ideal operation in a normal state of the input buffer illustrated in FIG. 13.

FIG. 16 is a diagram illustrating one example of a relation among each input signal, each output signal and each fault detection signal of the input buffer illustrated in FIG. 13.

FIG. 17 is a diagram illustrating one example of a relation between each input signal and each actual value of each input threshold value of each of comparators provided in the input buffer illustrated in FIG. 13.

DETAILED DESCRIPTION

Figure 1:
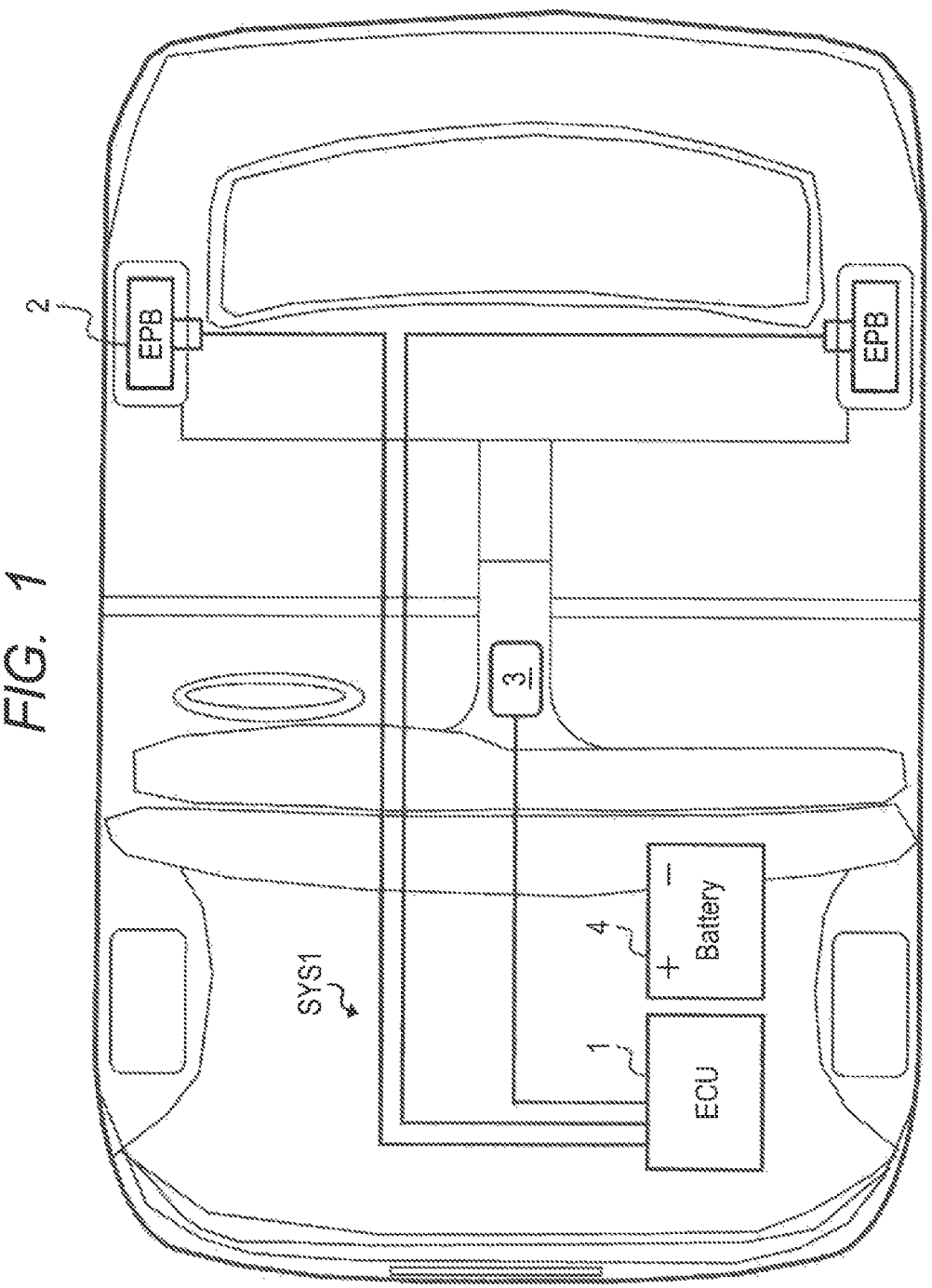
FIG. 1 is an outside view illustrating one example of a vehicle on which an engine control system according to a first embodiment is loaded.

In the following, preferred embodiments of the present invention will be described with reference to the drawings. Incidentally, since the drawings are simplified, the technical scope of the embodiments shall not be interpreted narrowly on the ground of illustrations in the drawings. In addition, the same symbols are assigned to the same elements and duplicated description thereof is omitted.

Although, in the following embodiments, description will be made by dividing into a plurality of sections or embodiments when division is requested for the convenience sake, these are not unrelated to one another and these are related to one another such that one covers some or all of altered examples, application examples, detailed explanations, supplemental explanations and so forth of the others unless otherwise clearly stated in particular. In addition, in the following embodiments, in a case where the number of constitutional elements and so forth (the number of units, a numerical value, an amount/a quantity, a range and so forth are included) is referred to, it is not limited to the specific number and may be at least and/or not more than the specific number unless otherwise clearly stated in particular and unless otherwise definitely limited to the specific number in principle.

Further, in the following embodiments, the constitutional elements (operation steps and so forth are also included) thereof are not necessarily essential unless otherwise clearly stated in particular and unless otherwise thought to be clearly essential in principle. Likewise, in the following embodiments, when the shapes of the constitutional elements and so forth, a positional relationship among them and so forth are referred to, the ones that are substantially approximate or similar to the shapes and so forth shall be included unless otherwise clearly stated in particular and unless otherwise clearly thought that they are not approximate or similar thereto in principle. The same is true of the above-mentioned number of constitutional elements and so forth (the number of units, the numerical value, the amount/the quantity, the range and so forth are included).

First Embodiment

FIG. 1 is an outside view illustrating one example of a vehicle on which an engine control system according to the first embodiment is loaded. In FIG. 1, a case where the engine control system is a system which controls an electric parking brake will be described by way of example.

As illustrated in FIG. 1, an engine control system SYS1 which is loaded on the vehicle includes, for example, an engine control unit 1, a battery power source 4 which supplies a power supply voltage to the engine control unit 1, an electric parking brake 2 which is driven by the engine control unit 1 and so forth.

Figure 2:
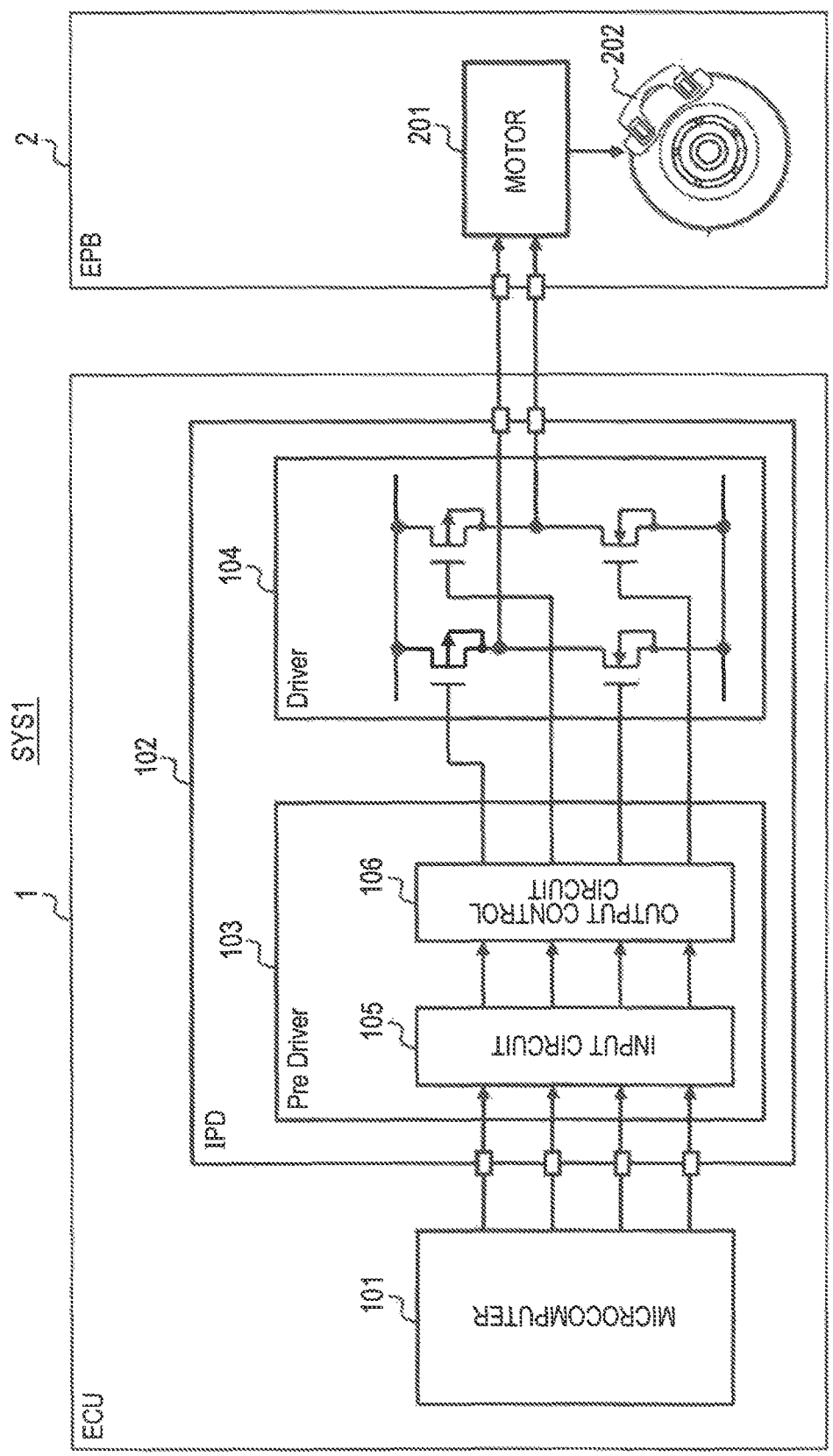
FIG. 2 is a diagram illustrating one example of a more specific configuration of the engine control system loaded on the vehicle illustrated in FIG. 1.

FIG. 2 is a diagram illustrating one example of a more specific configuration of the engine control system SYS1 loaded on the vehicle illustrated in FIG. 1. Incidentally, in constitutional elements of the engine control system SYS1, only the engine control unit 1 and the electric parking brake 2 are illustrated in FIG. 2.

The engine control unit 1 includes a microcomputer 101, an electric power control semiconductor device (IPD: (Intelligent Power Device) 102 and so forth.

The microcomputer 101 generates a control signal according to an on/off state of an operation button 3 (not illustrated in FIG. 2) and outputs the generated control signal to the electric power control semiconductor device 102. The electric power control semiconductor device 102 controls driving of the electric parking brake 2 on the basis of the control signal from the microcomputer 101.

The electric power control semiconductor device 102 includes a pre-driver 103 configured by an input circuit 105 and an output control circuit 106, an H-bridge type driver 104 configured by a plurality of transistors and so forth.

In the pre-driver 103, the input circuit 105 receives the control signal from the microcomputer 101 as an input signal and the output control circuit 106 generates an output signal according to the input signal. Then, the driver 104 outputs a drive signal according to the output signal from the pre-driver 103.

The electric parking brake 2 includes a motor 201, a brake 202 and so forth. The motor 201 is driven with the drive signal from the driver 104 and controls the brake 202.

The operation button 3 is set to an off-state, for example, while the vehicle is running. In this case, the microcomputer 101 maintains the control signal in an inactive state (for example, at a Lo level). Thereby, the electric power control semiconductor device 102 brings the electric parking brake 2 into a non-driven state so as not to apply a brake. Therefore, the vehicle maintains a running state.

Here, when the operation button 3 is switched from the off-state to an on-state by a driver while the vehicle is running, the microcomputer 101 switches the state of the control signal from the inactive state to an active state (for example, switches from the Lo level to a Hi level). Thereby, the electric power control semiconductor device 102 drives the electric parking brake 2 so as to apply the brake. Thereby, the running vehicle is stopped or decelerated.

Then, for example, when the operation button 3 is switched from the on-state to the off-state by the driver, the microcomputer 101 switches the state of the control signal again from the active state to the inactive state. Thereby, the electric power control semiconductor device 102 brings the electric parking brake 2 into the non-driven state so as not to apply the brake. Thereby, the vehicle is again brought into a runnable state by pressing an accelerator pedal.

Here, it is requested to the electric power control semiconductor device 102 to control driving of the electric parking brake 2 without impairing the safety performance. In particular, it is requested to the electric power control semiconductor device 102 to drive the electric parking brake 2 in the same manner as that in the normal state or at least to prevent sudden stopping and sudden starting of the vehicle (that is, to shift the electric parking brake to the failsafe operation) by bringing the electric parking brake 2 into the non-driven state even in a case where the input circuit 105 which receives the control signal from the microcomputer 101 has failed).

(Preliminary Examinations Made by Inventors and Others)

An input circuit 505 that the inventors and others have preliminarily examined will be described before describing the input circuit 105 which is provided in the electric power control semiconductor device 102 of the engine control system SYS1 loaded on the above-mentioned vehicle.

(First Configuration Example of Input Buffer in Preliminary Examinations)

Figure 11:
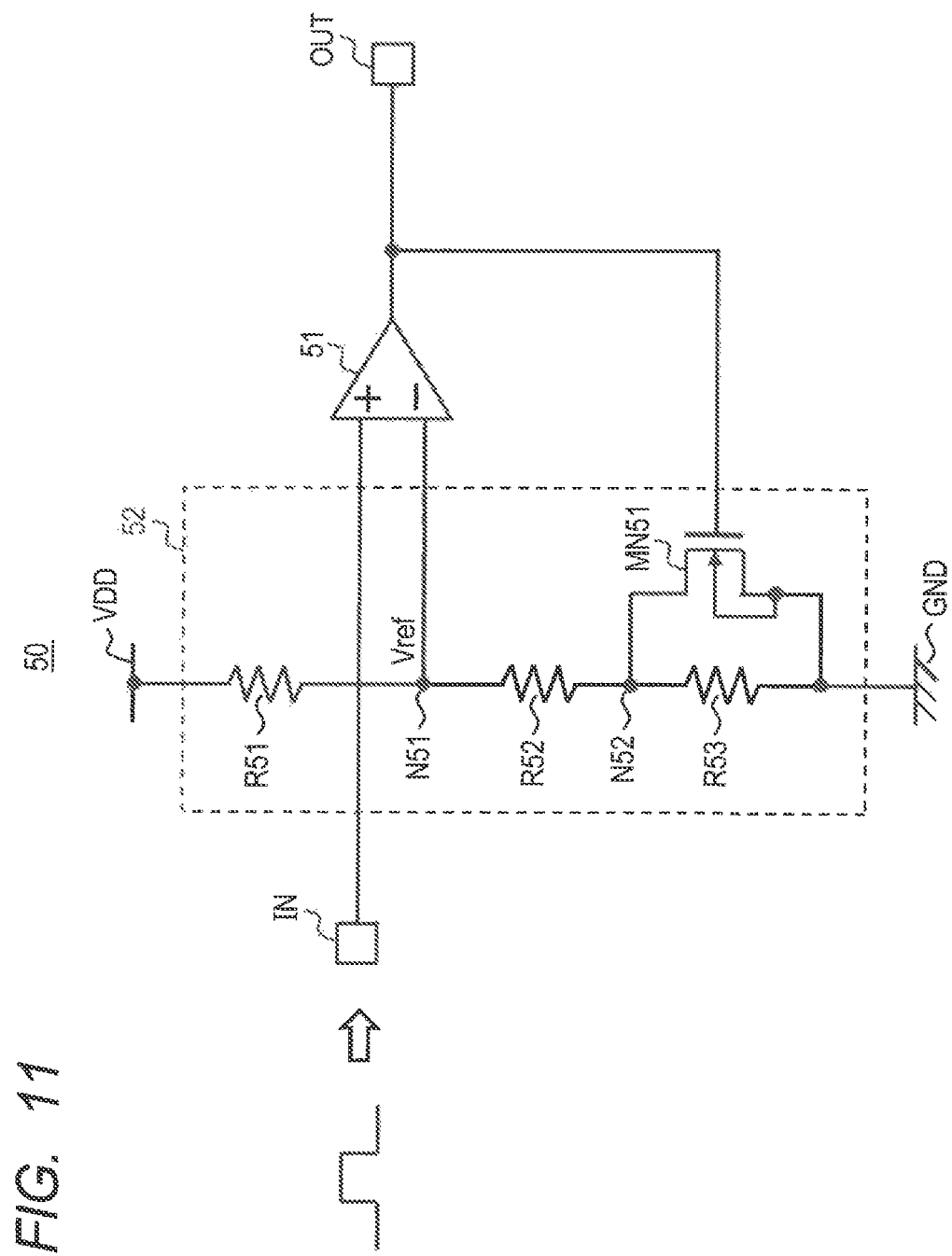
FIG. 11 is a diagram illustrating a first configuration example of an input buffer according to a conception established before leading to realization of embodiments.

FIG. 11 is a diagram illustrating one configuration example of an input buffer 50 according to a conception established before leading to realization of the embodiments. The input buffer 50 is provided in correspondence with each signal line of an input signal (specifically, the control signal from the microcomputer 101) which is supplied from the outside in the input circuit 505.

As illustrated in FIG. 11, the input buffer 50 includes a comparator 51 and a hysteresis circuit 52. Incidentally, for simplification of description, an ESD (Electro Static Discharge) protection element and so forth are omitted.

The comparator 51 compares a voltage of the input signal which is supplied to an input terminal IN from the outside with a reference voltage Vref and outputs a comparison result. The comparison result is output to the outside via an output terminal OUT. In the following, the input signal which is supplied from the outside to the input terminal IN will be referred to as an input signal IN and the signal which is output to the outside via the output terminal OUT will be referred to as an output signal OUT.

The hysteresis circuit 52 is a circuit which generates the reference voltage Vref of a voltage level according to the comparison result of the comparator 51. For example, in a case where the comparison result of the comparator 51 is at the Lo level, the hysteresis circuit 52 generates a high voltage side (that is, high potential side) reference voltage Vref (in the following, also referred to as an input threshold value VIH) and in a case where the comparison result of the comparator 51 is at the Hi level, the hysteresis circuit 52 generates a low voltage side (that is, low potential side) reference voltage Vref (in the following, also referred to as an input threshold value VIL).

Specifically, the hysteresis circuit 52 includes resistance elements R51 to R53 and an N-channel MOS transistor (in the following, simply referred to as a transistor) MN51. The resistance elements R51 to R53 are arranged in series between a power source voltage terminal VDD and a ground voltage terminal GND. The transistor MN51 is arranged between a node N52 between the resistance elements R52 and R53 and the ground voltage terminal GND and the comparison result of the comparator 51 is supplied to a gate thereof. A voltage at a node N51 between the resistance elements R51 and R52 is output as the reference voltage Vref.

In the following, an operation of the input buffer 50 will be described with reference to FIG. 12.

FIG. 12 is a diagram illustrating one example of a relation among each input signal, each output signal and each input threshold value of the comparator 51 provided in the input buffer 50. Incidentally, in the following, a case where the Lo level input signal IN is 0 V, the Hi level input signal IN is 5 V, the input threshold value VIL (the low voltage side reference voltage Vref) is 2 V and the input threshold value VIH (the high voltage side reference voltage Vref) is 3 V will be described by way of example.

First, the operation of the input buffer 50 in the normal state will be described.

For example, in a case where the input signal IN is at the Low level, the voltage (0 V) of the input signal IN is less than the input threshold value VIH (5 V) and therefore the comparator 51 outputs the Lo level comparison result (that is, the output signal OUT). At this time, since the Lo level comparison result is supplied to the gate of the transistor MN51, the transistor MN51 is turned off. Thereby, the voltage at the node N51 has a value obtained by dividing the voltage with resistors, that is, the resistance element R51 and the resistance elements R52 and R53 and therefore the reference voltage Vref is maintained at the high voltage (3 V). That is, the input threshold value is maintained at VIH.

Then, when the voltage of the input signal IN becomes at least the input threshold value VIH (3 V) by level changing of the input signal IN from the Lo level to the Hi level, the comparator 51 switches the level of the comparison result from the Lo level to the Hi level. At this time, the high level comparison result is supplied to the gate of the transistor MN51 and therefore the transistor MN51 is turned on. Thereby, the voltage at the node N51 has a value obtained by dividing the voltage with resistors, that is, mainly the resistance element R51 and the resistance element R52 and therefore the reference voltage Vref is switched from the high voltage to the low voltage (2 V). That is, the input threshold value is switched from VIH to VIL.

Then, when the voltage of the input signal IN becomes less than the input threshold value VIL (2 V) by level changing of the input signal IN from the Hi level to the Lo level, the comparator 51 switches the level of the comparison result of the Hi level to the Lo level. At this time, since the Lo-level comparison result is supplied to the gate of the transistor MN51, the transistor MN51 is turned off. Thereby, the voltage at the node N51 has a value obtained by dividing the voltage with resistors, that is, the resistance element R51 and the resistance elements R52 and R53 and therefore the reference voltage Vref is switched from the low voltage to the high voltage (3 V). That is, in constitutional elements of the engine control system SYS1 the input threshold value is switched from VIL to VIH.

Then, an operation of the input buffer 50 in a case where the comparator 51 has failed will be described.

For example, in a case where the comparison result of the comparator 51 has been fixed to the Lo level due to occurrence of the fault, the comparator 51 keeps outputting the Lo level comparison result irrespective of the level of the input signal IN. Here, in a case where the input signal IN is at the Lo level, the comparator 51 outputs the Low level comparison result which is the same as that in a normal state. However, in a case where the input signal IN is at the Hi level, the comparator 51 outputs the Lo level comparison result which is different from that in the normal state. As a result, it becomes difficult to drive the electric parking brake 2 even when the operation button 3 is switched on and it becomes difficult to stop or decelerate the vehicle.

In addition, in a case where the comparison result of the comparator 51 has been fixed to Hi level due to occurrence of the fault, the comparator 51 keeps outputting the Hi level comparison result irrespective of the level of the input signal IN. Here, in a case where the input signal IN is at the Hi level, the comparator 51 outputs the Hi level comparison result which is the same as that in the normal state. However, in a case where the input signal IN is at the Lo level, the comparator 51 outputs the Hi level comparison result which is different from that in the normal state. As a result, the electric parking brake 2 is driven even when the operation button 3 is switched off and the vehicle is stopped or decelerated unintentionally.

Accordingly, the inventors and others have examined a configuration making it possible to realize the operation which is the same as that in the normal state or at least to realize the failsafe operation even in a case where the input buffer has failed.

(Second Configuration Example of Input Buffer in Preliminary Examinations)

Figure 13:
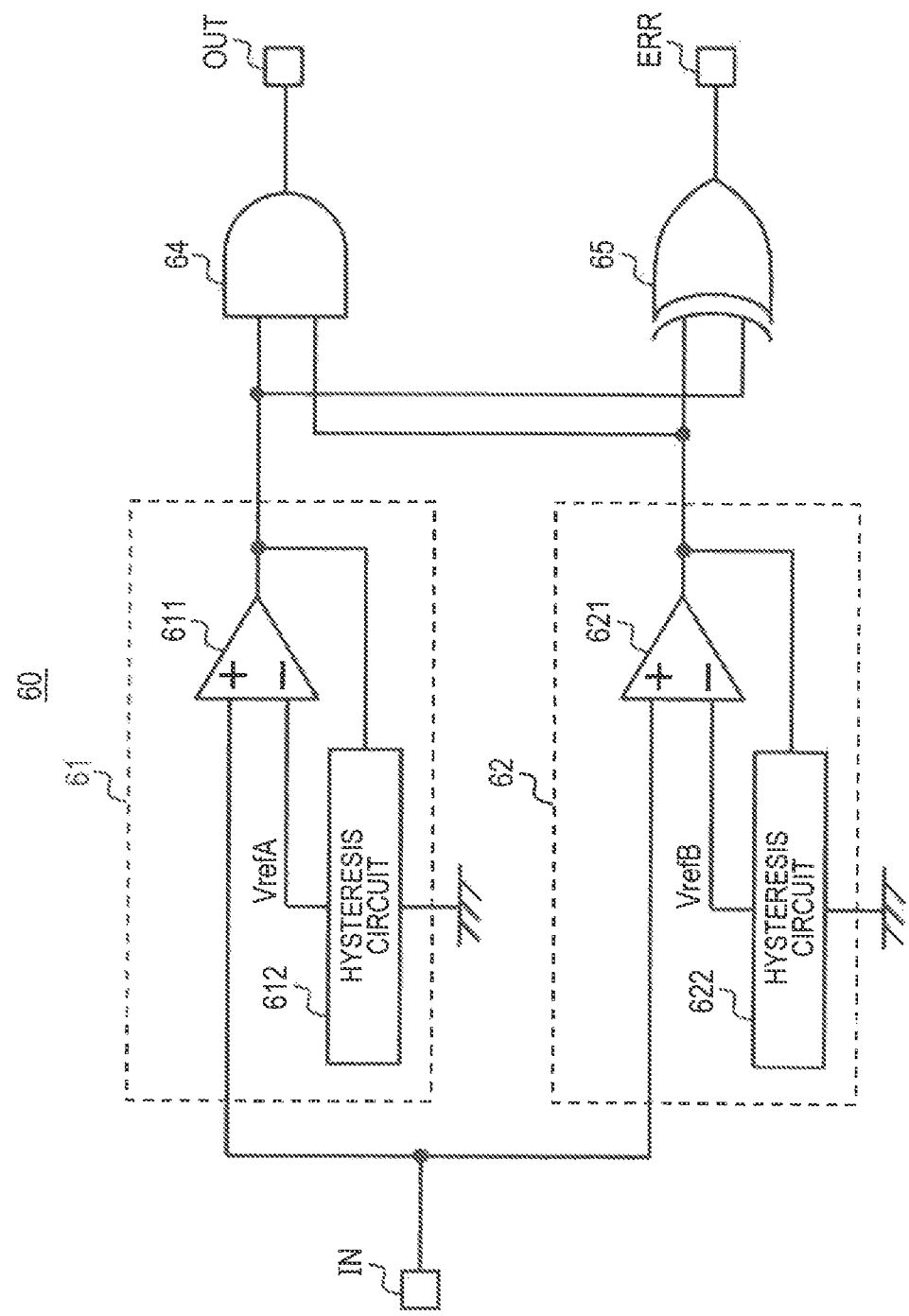
FIG. 13 is a diagram illustrating a second configuration example of an input buffer according to a conception established before leading to realization of the embodiments.

FIG. 13 is a diagram illustrating one configuration example of an input buffer 60 according to a conception established before leading to realization of the embodiments.

As illustrated in FIG. 13, the input buffer 60 includes a first comparison section 61, a second comparison section 62, a logical product circuit (in the following, referred to as an AND circuit) 64 and an exclusive logical sum circuit (in the following, referred to as an XOR circuit) 65. The first comparison section 61 includes a comparator 611 and a hysteresis circuit 612. The second comparison section 62 includes a comparator 621 and a hysteresis circuit 622.

Incidentally, the comparator 611 and the hysteresis circuit 612 in the first comparison section 61 correspond to the comparator 511 and the hysteresis circuit 512 in the input buffer 50 respectively. In addition, the comparator 621 and the hysteresis circuit 622 in the second comparison section 62 correspond to the comparator 511 and the hysteresis circuit 512 in the input buffer 50 respectively. That is, in the input buffer 60, two configurations each including the comparator 511 and the hysteresis circuit 512 in the input buffer 50 are arranged in parallel.

The comparator 611 compares the voltage of the input signal IN with a reference voltage VrefA and outputs a comparison result. The hysteresis circuit 612 generates the high voltage side or low voltage side reference voltage VrefA according to the comparison result of the comparator 611. In the following, the high voltage side reference voltage VrefA will be also referred to as an input threshold value VIHA and the low voltage side reference voltage VrefA will be also referred to as an input threshold value VILA.

The comparator 621 compares the voltage of the input signal IN with a reference voltage VrefB and outputs a comparison result. The hysteresis circuit 622 generates a high voltage side or low voltage side reference voltage VrefB according to the comparison result of the comparator 621. In the following, the high voltage side reference voltage VrefB will be also referred to as an input threshold value VIHB and the low voltage side reference voltage VrefB will be also referred to as an input threshold value VILB.

The AND circuit 64 outputs a logical product of the comparison results of the respective comparators 611 and 621. An output signal from the AND circuit 64 is output to the outside via an output terminal OUT. In the following, the output signal from the AND circuit 64 will be also referred to as an output signal OUT.

The XOR circuit 65 outputs an exclusive logical sum of the comparison results of the respective comparators 611 and 621. An output signal from the XOR circuit 65 is output to the outside via an output terminal ERR. In the following, the output signal from the XOR circuit 65 will be also referred to as a fault detection signal ERR.

In the following, an ideal operation of the input buffer 60 will be described with reference to FIG. 14 to FIG. 16. FIG. 14 is a diagram illustrating one example of a relation between each input signal and each ideal value of each input threshold value of each of the comparators 611 and 621 provided in the input buffer 60. FIG. 15 is a timing chart illustrating one example of the ideal operation of the input buffer 60 in the normal state. FIG. 16 is a diagram illustrating one example of a relation among each input signal, each output signal and each fault detection signal of the input buffer 60.

As illustrated in FIG. 14, in the following, a case where the Lo level input signal IN is 0 V, the Hi level input signal IN is 5 V, an ideal value of the input threshold values VILA and VILB (the low voltage side reference voltages VrefA and VrefB) is 2V and an ideal value of the input threshold values VIHA and VIHB (the high voltage side reference voltages VrefA and VrefB) is 3V will be described by way of example.

First, a normal operation of the input buffer 60 will be described with reference to FIG. 15 and FIG. 16.

For example, the input signal IN indicates the Lo level in an initial state (a time t60 to a time t61). At this time, since the voltage (0 V) of the input signal IN is less than the input threshold values VIHA and VIB (the ideal value: 3 V), both of the comparators 611 and 621 output the Lo level comparison results. Therefore, the AND circuit 64 outputs the Lo level output signal OUT. In addition, the XOR circuit 65 outputs the Lo level fault detection signal ERR indicating the normal state.

Incidentally, both of the reference voltages VrefA and VrefB are maintained at a high voltage (the ideal value: 3V) on the basis of the Lo level comparison results of the comparators 611 and 621. That is, the input threshold value of the comparator 611 is maintained at VIHA and the input threshold value of the comparator 621 is maintained at VIHB.

Then, the level of the input signal IN is changed from the Lo level to the Hi level (a time t61 to a time t63). When the voltage of the input signal IN becomes at least the input threshold values VIHA and VIHB (the ideal value: 3V) in the course of changing the signal level (the time t62), both of the comparators 611 and 621 switch the levels of the comparison results from the Lo level to the Hi level. Therefore, the AND circuit 64 outputs the Hi level output signal OUT. In addition, the XOR circuit 65 outputs the Lo level fault detection signal ERR indicating the normal state.

Incidentally, both of the reference voltages VrefA and VrefB are switched from the high voltages to the low voltages (the ideal value: 2 V) on the basis of the Hi level comparison results of the comparators 611 and 621. That is, the input threshold value of the comparator 611 is switched from VIHA to VILA and the input threshold value of the comparator 621 is switched from VIHB to VILB.

Then, the input signal IN is maintained at the Hi level (a time t63 to a time t64). At this time, since the voltage (5 V) of the input signal IN is at least the input threshold values VILA and VILB (the ideal value: 2 V), both of the comparators 611 and 621 output the Hi level comparison results. Therefore, the AND circuit 64 outputs the Hi level output signal OUT. In addition, the XOR circuit 65 outputs the Lo level fault detection signal indicating the normal state.

Incidentally, the reference voltages VrefA and VrefB are maintained at the low voltages (the ideal value: 2 V) on the basis of the Hi level comparison results of the comparators 611 and 621. That is, the input threshold value of the comparator 611 is maintained at VIHA and the input threshold value of the comparator 621 is maintained at VILB.

Then, the level of the input signal IN is changed from the Hi level to the Lo level (a time t64 to a time t66). When the voltage of the input signal IN becomes less than the input threshold values VIHA and VIHB (the ideal value: 3V) in the course of changing the signal level (the time t65), both of the comparators 611 and 621 switch the comparison results from the Hi level to the Lo level. Therefore, the AND circuit 64 outputs the Lo level output signal OUT. In addition, the XOR circuit 65 outputs the Lo level fault detection signal ERR indicating the normal state.

Incidentally, both of the reference voltages VrefA and VrefB are switched from the low voltages to the high voltages (the ideal value: 2 V) on the basis of the Lo level comparison results of the comparators 611 and 621. That is, the level of the input threshold value of the comparator 611 is switched from VILA to VIHA and the level of the input threshold value of the comparator 621 is switched from VILB to VIHB.

Then, an operation of the input buffer 60 in a case where either the comparator 611 or the comparator 621 has failed will be described with reference to FIG. 16.

For example, in a case where the level of the comparison result of the comparator 611 has been fixed to the Lo level due to occurrence of the fault, the comparator 611 keeps outputting the Lo level comparison result irrespective of the level of the input signal IN. Thereby, the AND circuit 64 keeps outputting the Lo level output signal OUT irrespective of the level of the input signal IN. In addition, in a case where the input signal IN is at the Lo level, the XOR circuit 65 outputs the Lo level fault detection signal ERR indicating the normal state and in a case where the input signal IN is at the Hi level, the XOR circuit 65 outputs the Hi level fault detection signal ERR indicating occurrence of the fault.

That is, in the input buffer 60, in a case where the input signal IN is at the Lo level, the Lo level output signal OUT which is the same as that in the normal state is output and the Lo level fault detection signal ERR indicating the normal state is output even in a case where the comparison result of the comparator 611 has been fixed to the Lo level due to occurrence of the fault. That is, the normal operation is realized.

On the other hand, in a case where the input signal IN is at the Hi level, the low level output signal which is different from that in the normal state is output and the Hi level fault detection signal ERR indicating occurrence of the fault is output. In this case, although the normal operation is not realized, the failsafe operation is realized. Specifically, the level of the output signal OUT is switched to the Lo level and thereby the electric parking brake 2 is brought into the non-driven state. Incidentally, in a case where the level of the fault detection signal ERR has been changed to the Hi level, it is conceived that, for example, a separately arranged electric parking brake is operated instead, a foot brake is operated instead and/or use of a manual foot brake is notified to the driver.

In addition, for example, in a case where the level of the comparison result of the comparator 611 has been fixed to the Hi level due to occurrence of the fault, the comparator 611 keeps outputting the Hi level comparison result irrespective of the level of the input signal IN. Thereby, the AND circuit 64 outputs the input signal IN as it is as the output signal OUT. Incidentally, in a case where the input signal IN is at the Hi level, the XOR circuit 65 outputs the Lo level fault detection signal ERR indicating the normal state and in a case where the input signal IN is at the Lo level, the XOR circuit 65 outputs the Hi level fault detection signal ERR indicating occurrence of the fault.

That is, in the input buffer 60, even in a case where the level of the comparison result of the comparator 611 has been fixed to the Hi level due to occurrence of the fault, the output signal OUT which is the same as the input signal IN in logical level is output similarly to the case of the normal state. That is, the normal operation is realized.

In regard to a case where the comparator 621 has failed, the comparator 611 may be replaced with the comparator 621 and the comparator 621 may be replaced with the comparator 611 respectively in the description of the operation performed in a case where the above-mentioned comparator 611 has failed and therefore the description thereof is omitted.

Even in a case where one of the comparators 611 and 621 has failed, the input buffer 60 is able to realize the operation which is the same as that in the normal state or to realize at least the failsafe operation in this way.

However, it has been found that the input buffer 60 has emerging issues.

In the following, the emerging issues of the input buffer 60 will be described.

(Emerging Issues of Input Buffer 60)

Figure 18:
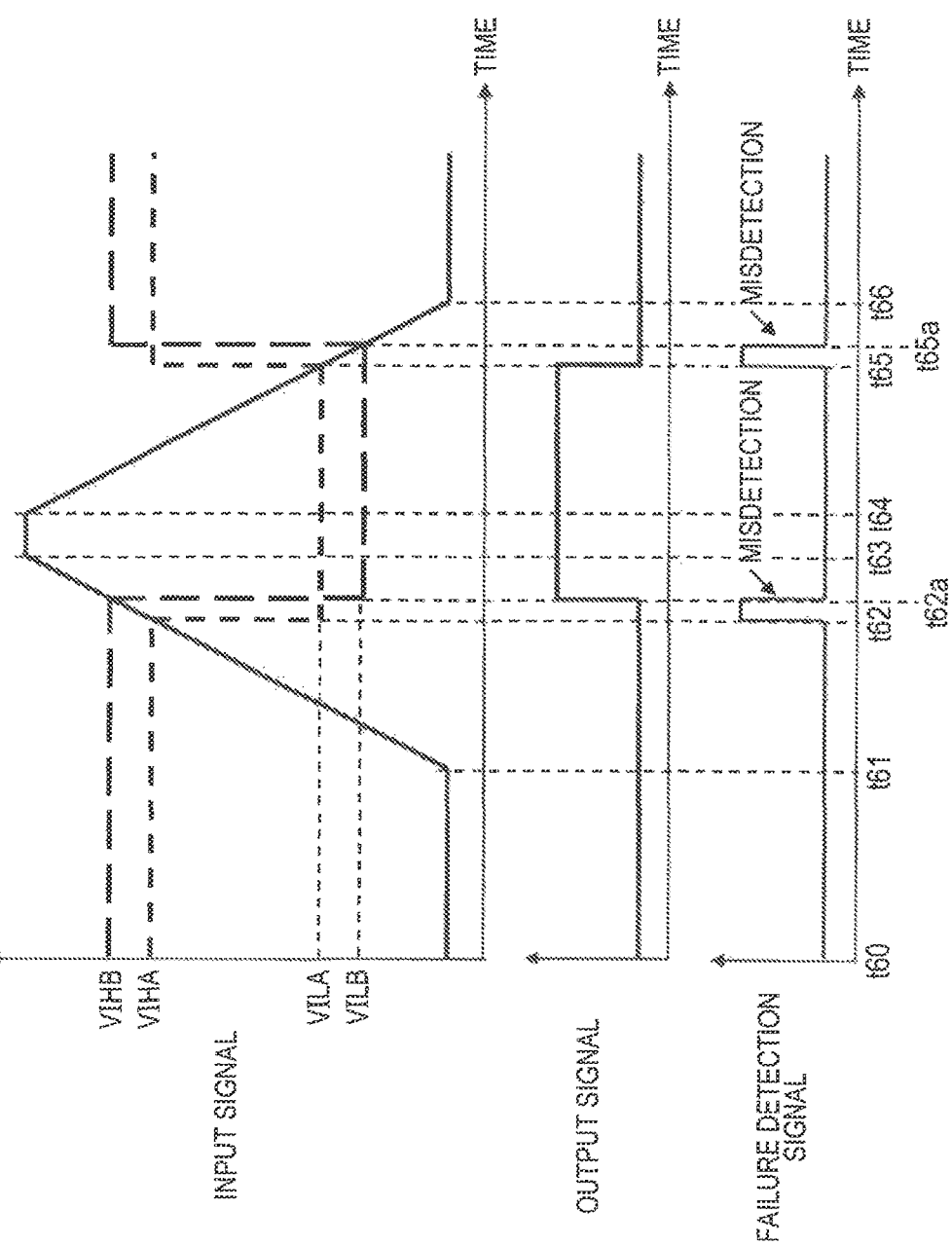
FIG. 18 is a timing chart illustrating one example of an actual operation in the normal state of the input buffer illustrated in FIG. 13.

FIG. 17 is a diagram illustrating one example of a relation between each input signal and each actual value of each input threshold value of each of the comparators 611 and 621 provided in the input buffer 60. FIG. 18 is a timing chart illustrating one example of the actual operation of the input buffer 60.

Although it is assumed that the input threshold values of the comparators 611 and 621 are the same as each other in the input buffer 60, it is difficult to make the respective input threshold values of the comparators 611 and 621 completely match each other under the influence of a variation in manufacturing.

Therefore, in the following, a case where the actual value of the input threshold value VIHA is 3 V, the actual value of the input threshold value VILA is 2 V, the actual value of the input threshold value VIHB is 3.1 V and the actual value of the input threshold value VILB is 1.9 V as illustrated in FIG. 17 will be described by way of example.

As illustrated in 18, in the course of level changing of the input signal IN from the Lo level to the Hi level, when the value of the voltage of the input signal IN becomes at least the input threshold value VIHA (the actual value: 3 V) and less than the input threshold value VIHB (the actual value: 3.1 V) (the time t62), the comparator 611 switches the level of the comparison result from the Lo level to the Hi level. On the other hand, since the voltage value of the input signal IN is less than the input threshold value VIHB (the actual value: 3.1 V), the comparator 621 keeps outputting the lo level comparison result. Accordingly, the AND circuit 64 keeps outputting the Lo level output signal OUT. Here, the XOR circuit 65 outputs the Hi level fault detection signal ERR indicating occurrence of the fault in spite of the normal states of both of the comparators 611 and 621. Therefore, there is the possibility that driving of the electric parking brake 2 may not be accurately performed in spite of the normal states of both of the comparators 611 and 621.

Incidentally, at this time, the reference voltage VrefA is switched from the high voltage (the actual value: 3 V) to the low voltage (the actual value: 2 V) and the reference voltage VrefB is maintained at the high voltage (the actual value: 3.1 V). That is, the input threshold value of the comparator 611 is switched from VIHA to VILA and the input threshold value of the comparator 621 is maintained at VIHB.

Then, when the voltage value of the input signal IN becomes at least the input threshold value VIHB (a time 62a), the comparator 621 switches the level of the comparison result from the Lo level to the Hi level. At this time, the comparator 611 outputs the Hi level comparison result. Accordingly, the AND circuit 64 outputs the Hi level output signal OUT. In addition, the XOR circuit 65 outputs the Lo level fault detection signal ERR indicating the normal state. Incidentally, at this time, the reference voltage VrefB is switched from the high voltage (the actual value: 3.1 V) to the low voltage (the actual value: 1.9 V). That is, the input threshold value of the comparator 621 is switched from VIHB to VILB.

Then, after the input signal IN has been maintained at the Hi level (the time t63 to the time t64), the level of the input signal IN is changed from the Hi level to the Lo level (the time t63 to the time t66). When the voltage value of the input signal IN becomes less than the input threshold value VILA (the actual value: 2 V) and at least the input threshold value VILB (the actual value: 1.9 V) (the time t65) in the course of level changing of the input signal IN from the Hi level to the Lo level, the comparator 611 switches the level of the comparison result from the Hi level to the Lo level. On the other hand, since the voltage value of the input signal IN is at least the input threshold value VILB (the actual value: 1.9 V), the comparator 621 keeps outputting the Hi level comparison result. Therefore, the AND circuit 64 outputs the Lo level output signal OUT. Here, the XOR circuit 65 outputs the Hi level fault detection signal ERR indicating occurrence of the fault in spite of the normal states of both of the comparators 611 and 621. Accordingly, there is the possibility that releasing of driving of the electric parking brake 2 may not be accurately performed in spite of the normal operations of both of the comparators 611 and 621.

Incidentally, at this time, the reference voltage VrefA is switched from the low voltage (the actual value: 2V) to the high voltage (the actual value: 3 V) and the reference voltage VrefB is maintained at the low voltage (the actual value: 1.9 V). That is, the input threshold value of the comparator 611 is switched from VILA to VIHA and the input threshold value of the comparator 621 is maintained at VILB.

Then, when the voltage value of the input signal IN becomes less than the input threshold value VILB (a time t65a), the comparator 621 switches the level of the comparison result from the Hi level to the Lo level. At this time, the comparator 611 outputs the Lo level comparison result.

Therefore, the AND circuit 64 keeps outputting the Lo level output signal OUT. In addition, the XOR circuit 65 keeps outputting the Lo level output signal OUT indicating the normal state. Incidentally, at this time, the reference voltage VrefB is switched from the low voltage (the actual value: 1.9 V) to the high voltage (the actual value: 3.1 V). That is, the input threshold value of the comparator 621 is switched from VILB to VIHB.

Since other actual operations of the input buffer 60 are the same as the ideal operations of the input buffer 60, description thereof is omitted.

There is the possibility that the input buffer 60 may detect the fault by mistake caused by mismatching of the respective input threshold values of the comparators 611 and 621 which has occurred under the influence of a variation in manufacturing in spite of the normal states of the comparators 611 and 621. As a result, there is the possibility that it may become difficult for the electric power control semiconductor device which is provided with the input buffer 60 to accurately control driving of the electric parking brake 2.

Figure 19:
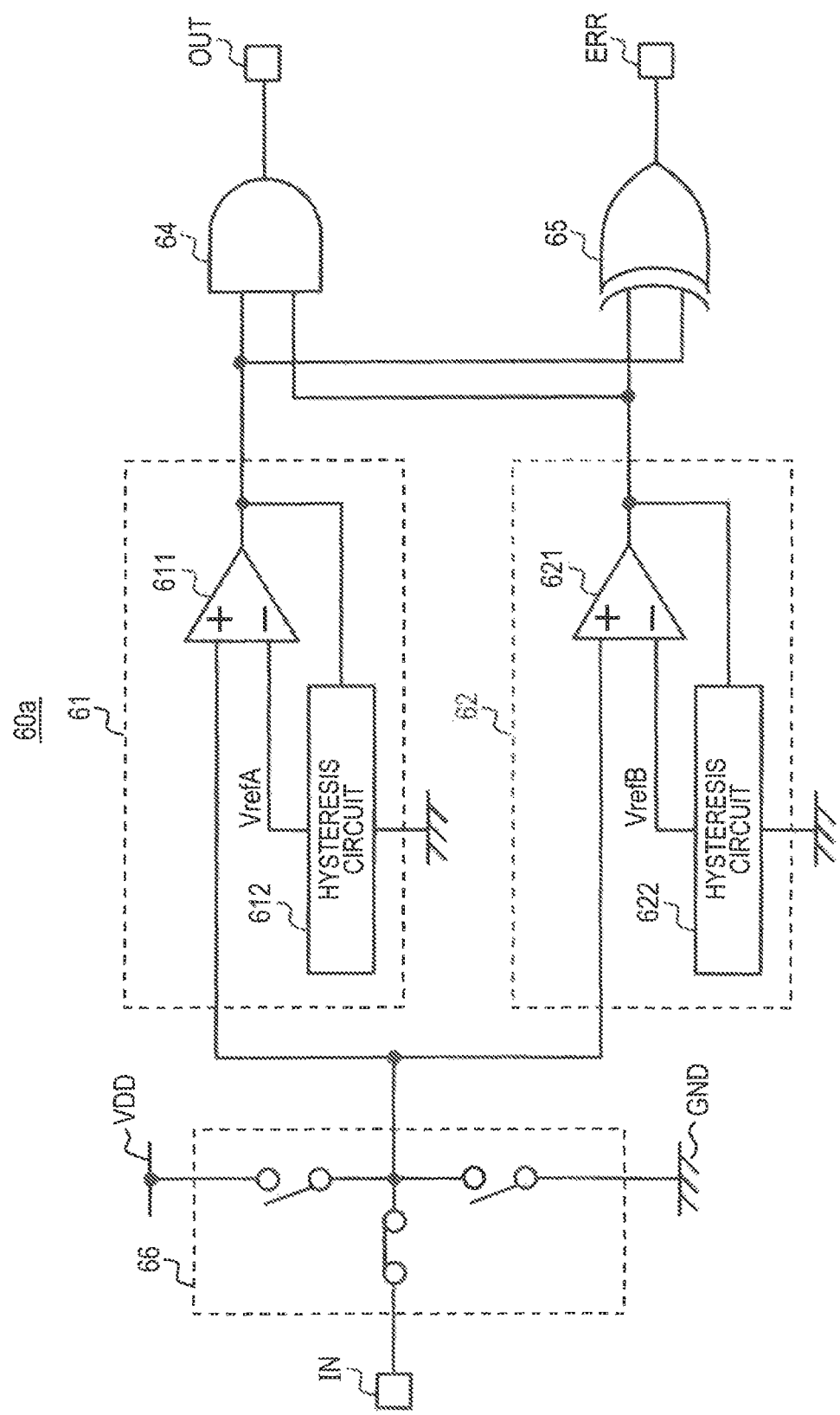
FIG. 19 is a diagram illustrating a modification example of the input buffer illustrated in FIG. 13.

Incidentally, it is also conceived to additionally provide a BIST (Built In Self-Test) circuit 66 for the configuration of the input buffer 60 as in a configuration of an input buffer 60a illustrated in FIG. 19 in order to prevent misdetection of the fault. However, fault diagnosis using the BIST circuit 66 is performed before and after execution of the normal operation and it is difficult to perform fault diagnosis in real time in the normal operation. Therefore, in a case where the fault has occurred in the normal operation, fault detection may not be performed until fault diagnosis is performed after the normal operation has been terminated.

Therefore, an input buffer 10 according to the first embodiment has been conceived of in order to make real-time execution of fault diagnosis possible while suppressing misdetection of the fault.

(Description of Input Buffer 10 According to First Embodiment)

Figure 3:
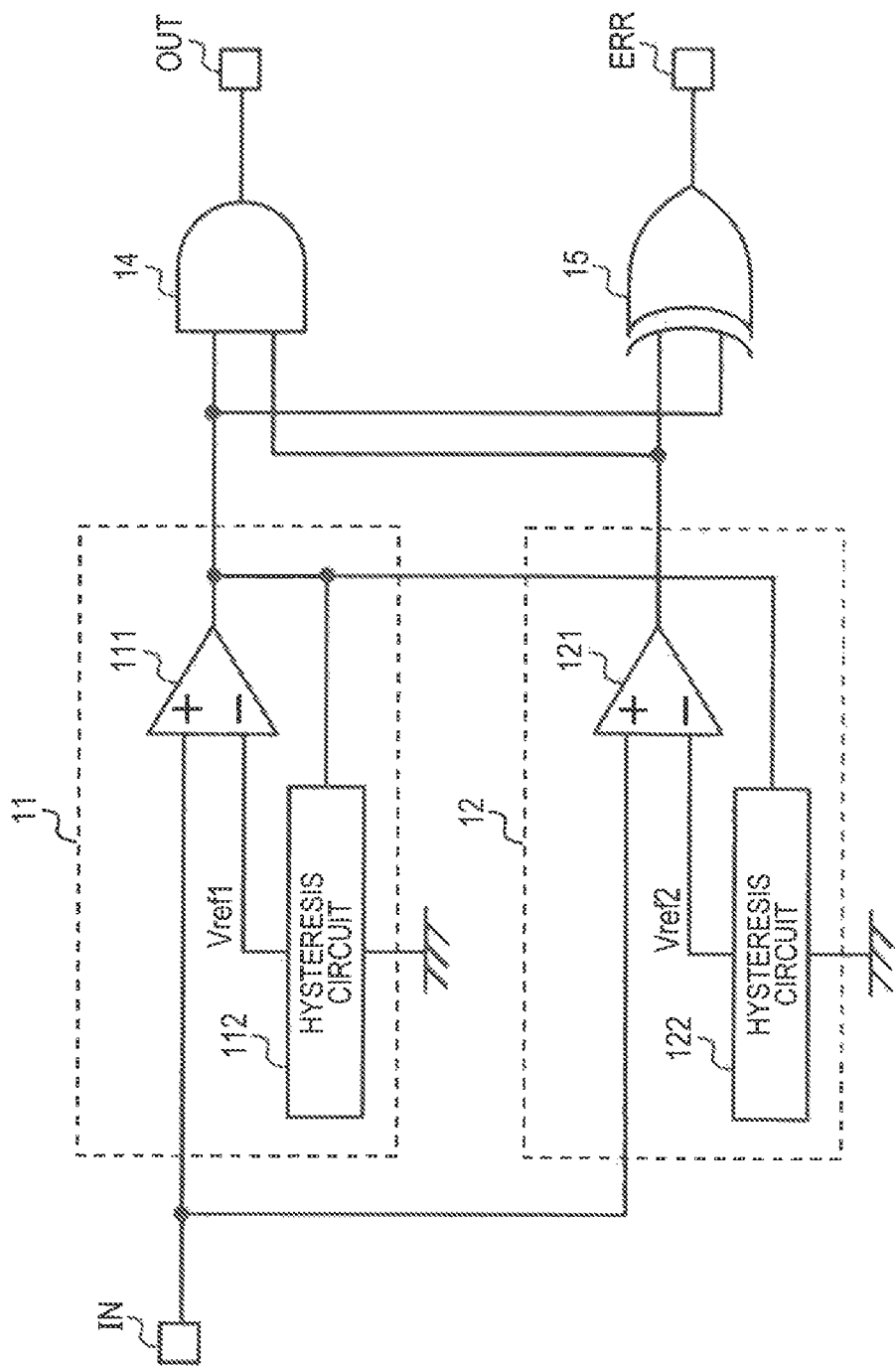
FIG. 3 is a diagram illustrating one configuration example of an input buffer according to the first embodiment.

FIG. 3 is a diagram illustrating one configuration example of the input buffer 10 according to the first embodiment.

As illustrated in FIG. 3, the input buffer 10 includes a first comparison section 11, a second comparison section 12, an AND circuit (an output signal generation section) 14, an XOR circuit (a fault detection signal generation section) 15 and so forth. The first comparison section 11 includes a comparator (a first comparator) 111, a hysteresis circuit (a first reference voltage generation unit) 112 and so forth. The second comparison section 12 includes a comparator (a second comparator) 121, a hysteresis circuit (a second reference voltage generation section) 122 and so forth.

The comparator 111 compares the voltage of the input signal IN with a reference voltage Vref1 and outputs a comparison result (a first comparison result). The hysteresis circuit 112 generates the high voltage side or low voltage side reference voltage Vref1 according to the comparison result of the comparator 111. In the following, the high voltage side reference voltage Vref1 will be also referred to as an input threshold value VIH1 and the low voltage side reference voltage Vref1 will be also referred to as an input threshold value VIL1.

The comparator 121 compares the voltage of the input signal IN with a reference voltage Vref2 and outputs a comparison result (a second comparison result). The hysteresis circuit 122 generates the high voltage side or low voltage side reference voltage Vref2 according to a comparison result of the comparator 111 which is provided in the first comparison section 11. In the following, the high voltage side reference voltage Vref2 will be also referred to as an input threshold value VIH2 and the low voltage side reference voltage Vref2 will be also referred to as an input threshold value VIL2.

Here, the hysteresis circuits 112 and 122 are configured so as to meet VIH1<VIH2 and VIL1>VIL2 after the influence of the variation in manufacturing has been taken into consideration.

The AND circuit 14 outputs a logical product of the respective comparison results of the comparators 111 and 121. An output signal from the AND circuit 14 is output to the outside via the output terminal OUT. In the following, the output signal from the AND circuit 14 will be also referred to as the output signal OUT.

The XOR circuit 15 outputs an exclusive logical sum of the respective comparison results of the comparators 111 and 121. An output signal from the XOR circuit 15 is output to the outside via the output terminal ERR. In the following, the output signal from the XOR circuit 15 will be also referred to as the fault detection signal ERR.

In the following, an operation of the input buffer 10 will be described with reference to FIG. 4 to FIG. 7.

Figure 5:
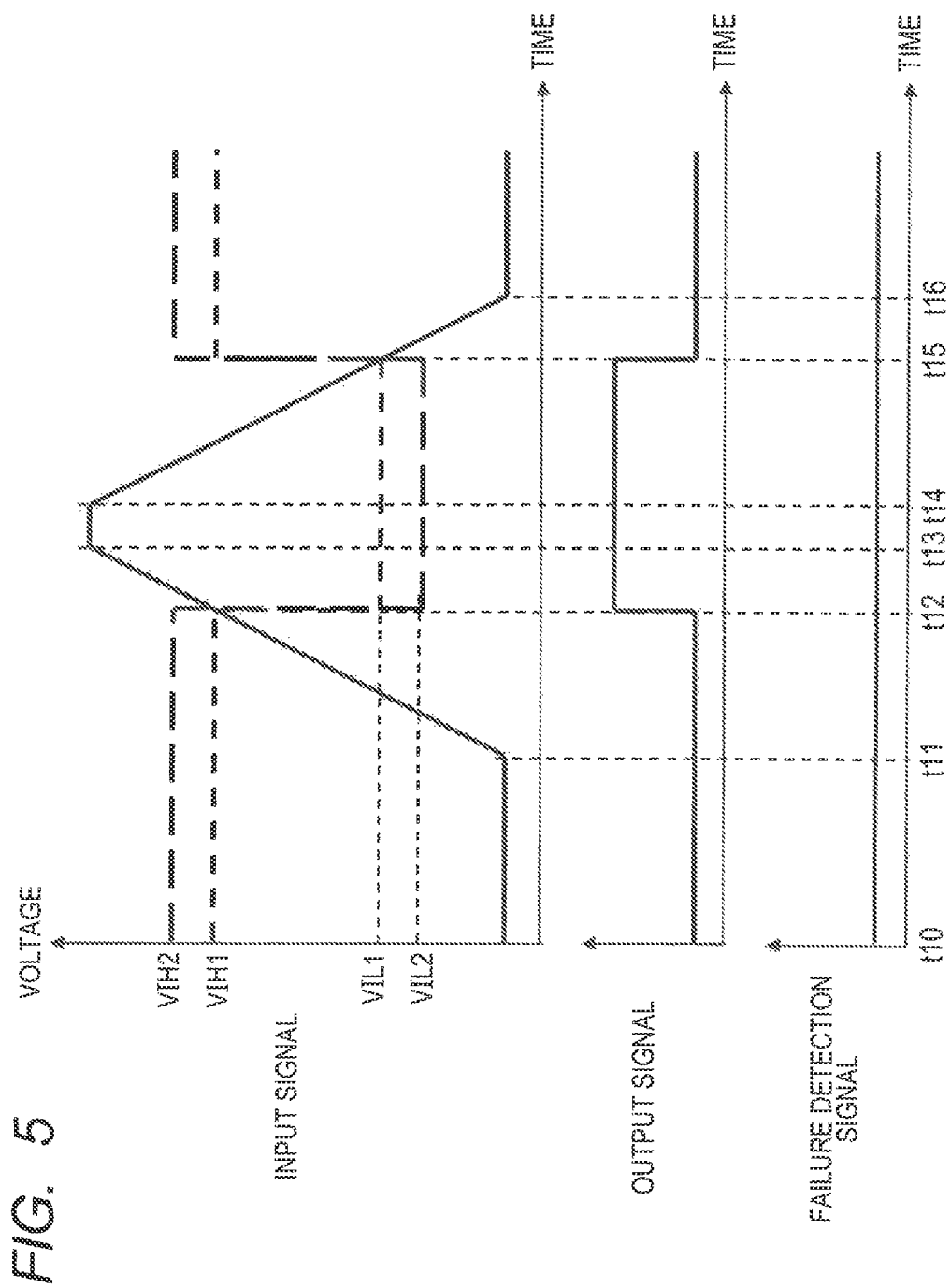
FIG. 5 is a timing chart illustrating one example of an operation in a normal state of the input buffer illustrated in FIG. 3.

FIG. 4 is a diagram illustrating one example of a relation between each input signal and each input threshold value of each of the comparators 111 and 121 provided in the input buffer 10. FIG. 5 is a timing chart illustrating one example of an operation of the input buffer 10 in the normal state. FIG. 6 is a timing chart illustrating one example of an operation of the input buffer 10 in occurrence of the fault. FIG. 7 is a diagram illustrating one example of a relation among each input signal, each output signal and each fault detection signal of the input buffer 10.

As illustrated in FIG. 4, in the following, a case where the Lo level input signal is 0V, the Hi level input signal is 5 V, the input threshold value VIH1 (the high voltage side reference voltage Vref1) is 3 V, the input threshold value VIL1 (the low voltage side reference voltage Vref1) is 2 V, the input threshold value VIH2 (the high voltage side reference voltage Vref2) is 3.1 V and the input threshold value VIL2 (the low voltage side reference voltage Vref2) is 1.9 V will be described by way of example.

First, the normal operation of the input buffer 10 will be described with reference to FIG. 5 and FIG. 7.

For example, the input signal IN indicates the Lo level in the initial state (a time t10 to a time t11). At this time, since the voltage (0 V) of the input signal IN is less than the input threshold values VIH1 (3 V) and VIH2 (3.1 V), both of the comparators 111 and 121 output the Lo level comparison results. Therefore, the AND circuit 14 outputs the Lo level output signal OUT. In addition, the XOR circuit 15 outputs the Lo level fault detection signal ERR indicating the normal state.

Incidentally, both of the reference voltages Vref1 and Vref2 are maintained at the high voltage values (3 V and 3.1 V) on the basis of the Lo level comparison result of the comparator 111. That is, the input threshold value of the comparator 111 is maintained at VIH1 and the input threshold value of the comparator 121 is maintained at VIH2.

Then, the level of the input signal IN is changed from the Lo level to the Hi level (a time t11 to a time t13). When the voltage value of the input signal IN becomes at least the input threshold value VIH1 in the course of level changing of the input signal IN (the time t12), the comparator 111 switches the level of the comparison result from the Lo level to the Hi level.

At this time, the reference voltage Vref1 is switched from the high voltage (3 V) to the low voltage (2 V) and the reference voltage Vref2 is switched from the high voltage (3.1 v) to the low voltage (1.9 v) on the basis of the Hi level comparison result of the comparator 111. That is, the input threshold value of the comparator 111 is switched from VIH1 to VIL1 and the input threshold value of the comparator 121 is switched from VIH2 to VIL2.

Thereby, the comparator 121 switches the level of the comparison result from the Lo level to the Hi level together with signal level switching by the comparator 111 before the voltage value of the input signal IN reaches the input threshold value VIH2. Therefore, the AND circuit 14 outputs the Hi level output signal OUT (the time t12). In addition, the XOR circuit 15 outputs the Lo level fault detection ERR indicating the normal state (the time t12).

That is, even in a case where the input threshold values of the comparators 111 and 121 deviate from the ideal values under the influence of the variation in manufacturing, the input buffer 10 is able to execute fault diagnosis in real time with no misdetection of the fault differently from the case of the input buffer 60. As a result, the electric power control semiconductor device 102 which is provided with the input buffer 10 is able to accurately drive the electric parking brake 2 without being influenced by misdetection of the fault.

Then, the input signal IN is maintained at the Hi level (a time t13 to a time t14). At this time, since the voltage value (5 V) of the input signal IN is higher than the input threshold values VIL1 (2 V) and VIL2 (1.9 V), both of the comparators 111 and 121 output the Hi level comparison results. Therefore, the AND circuit 14 outputs the Hi level output signal OUT. In addition, the XOR circuit 15 outputs the Lo level fault detection signal ERR indicating the normal state.

Incidentally, both of the reference voltages Vref1 and Vref2 are maintained at the low voltage values (2 V and 1.9 V) on the basis of the Hi level comparison result of the comparator 111. That is, the input threshold value of the comparator 111 is maintained at VIL1 and the input threshold value of the comparator 121 is maintained at VIL2.

Then, the level of the input signal IN is changed from the Hi level to the Lo level (a time t14 to a time t16). When the voltage value of the input signal IN becomes less than the input threshold value VIL1 in the course of level changing of the input signal IN (the time t15), the comparator 111 switches the level of the comparison result from the Hi level to the Lo level.

At this time, the reference voltage Vref1 is switched from the low voltage (2 V) to the high voltage (3 V) and the reference voltage Vref2 is switched from the low voltage (1.9 V) to the high voltage (3.1 V) on the basis of the Lo level comparison result of the comparator 111. That is, the input threshold value of the comparator 111 is switched from VIL1 to VIH1 and the input threshold value of the comparator 121 is switched from VIL2 to VIH2.

Thereby, the comparator 121 switches the level of the comparison result from the Hi level to the Lo level together with signal level switching by the comparator 111 before the voltage value of the input signal IN reaches the input threshold value VIH2. Therefore, the AND circuit 14 outputs the Lo level output signal OUT (the time t15). In addition, the XOR circuit 15 outputs the Lo level fault detection ERR indicating the normal state (the time t15).

That is, even in a case where the input threshold values of the comparators 111 and 121 deviate from the ideal values under the influence of the variation in manufacturing, the input buffer 10 is able to execute fault diagnosis in real time with no misdetection of the fault differently from the case of the input buffer 60. As a result, the electric power control semiconductor device 102 which is provided with the input buffer 10 is able to accurately bring the electric parking brake 2 into a non-driven state without being influenced by misdetection of the fault.

Then, an operation of the input buffer 10 performed in a case where either the comparator 111 or the comparator 121 has failed will be described with reference to FIG. 6 and FIG. 7. Incidentally, an operation of the input buffer 10 performed in a case where the level of the comparison result of the comparator 111 has been fixed to the Lo level is illustrated in the timing chart in FIG. 6 as one example.

For example, in a case where the level of the comparison result of the comparator 111 has been fixed to the Lo level due to occurrence of the fault, the comparator 111 keeps outputting the Lo level comparison result irrespective of the level of the input signal IN. Thereby, the AND circuit 14 keeps outputting the Lo level output signal OUT irrespective of the level of the input signal IN. In addition, in a case where the input signal IN is at the Lo level, the XOR circuit 15 outputs the Lo level fault detection signal ERR indicating the normal state and in a case where the input signal IN is at the Hi level, the XOR circuit 15 outputs the Hi level fault detection signal ERR indicating occurrence of the fault.

That is, in the input buffer 10, in a case where the input signal IN is at the Lo level, the Lo level output signal OUT which is the same as that in the normal state is output and the Lo level fault detection signal ERR indicating the normal state is output even in a case where the level of the comparison result of the comparator 111 has been fixed to the Lo level due to occurrence of the fault. That is, the normal operation is realized.

On the other hand, in a case where the input signal IN is at the Hi level, the Lo level output signal which is different from that in the normal state and the Hi level fault detection signal ERR indicating occurrence of the fault is output. In this case, although the normal operation is not realized, the failsafe operation is realized. Specifically, the level of the output signal OUT is switched to the Lo level and thereby the electric parking brake 2 is brought into the non-driven state. Incidentally, in a case where the level of the fault detection signal ERR has been changed to the Hi level, it is conceived that, for example, the separately arranged electric parking brake is operated instead, the foot brake is operated instead and/or use of the manual foot brake is notified to the driver.

In addition, for example, in a case where the level of the comparison result of the comparator 111 has been fixed to the Hi level due to occurrence of the fault, the comparator 111 keeps outputting the Hi level comparison result irrespective of the level of the input signal IN. Thereby, the AND circuit 14 outputs the input signal IN as it is as the output signal OUT. Incidentally, in a case where the input signal IN is at the Hi level, the XOR circuit 15 outputs the Lo level fault detection signal ERR indicating the normal state and in a case where the input signal IN is at the Lo level, the XOR circuit 15 outputs the Hi level fault detection signal ERR indicating occurrence of the fault.

That is, in the input buffer 10, even in a case where the level of the comparison result of the comparator 111 has been fixed to the Hi level due to occurrence of the fault, the output signal OUT which is the same as the input signal IN in logical level is output similarly to the case of the normal state. That is, the normal operation is realized.

In regard to a case where the comparator 121 has failed, the comparator 111 may be replaced with the comparator 121 and the comparator 121 may be replaced with the comparator 111 respectively in the description of the operation performed in a case where the above-mentioned comparator 111 has failed and therefore the description thereof is omitted.

The input buffer 10 according to the first embodiment includes the two comparison sections 11 and 12 one of which compares the voltage of the input signal IN with the reference voltage Vref1 and the other of which compares the voltage of the input signal IN with the reference voltage Vref2 respectively and the levels (the input threshold values) of the reference voltages Vref1 and Vref2 of the two comparison sections 11 and 12 are switched on the basis of the comparison result of the main comparison section 11 in this way. Here, the input buffer 10 is configured such that the high voltage side reference voltage Vref1 (the input threshold value VIH1) becomes lower than the high voltage side reference voltage Vref2 (the input threshold value VIH2) and is also configured such that the low voltage side reference voltage Vref1 (the input threshold value VIL1) becomes higher than the low voltage side reference voltage Vref2 (the input threshold value VIL2). Thereby, in a case where the voltage level of the input signal IN has been shifted, the voltage value of the input signal IN typically reaches the input threshold value of the main comparison section 11 earlier than it reaches the input threshold value of the sub comparison section 12 and therefore the comparison result of the main comparison section 11 is switched earlier than the comparison result of the sub comparison section 12 is switched. When the comparison result of the main comparison section 11 is switched, the levels (the input threshold values) of the reference voltages Vref1 and Vref2 of the two comparison sections 11 and 12 are switched all at once and therefore also the comparison result of the sub comparison section 12 is switched together with switching of the comparison result of the main comparison section 11.

Thereby, even in a case where the input threshold values of the comparison sections 11 and 12 deviate from the ideal values under the influence of the variation in manufacturing, the input buffer 10 according to the first embodiment is able to execute fault diagnosis in real time with no misdetection of the fault differently from the case of the input buffer 60.

Incidentally, as a matter of course, even in a case where either the comparator 111 or the comparator 121 has failed, the input buffer 10 according to the first embodiment is able to realize the operation which is the same as that in the normal state and/or to realize at least the failsafe operation as in the case of the input buffer 60. From the foregoing, the electric power control semiconductor device 102 which is provided with the input buffer 10 is able to accurately control driving of the electric parking brake 2.

In addition, since provision of the BIST circuit is not requested to the input buffer 10 according to the first embodiment, it is possible to suppress an increase in circuit scale, to avoid complication of the design and further to suppress an increase in test time.

Further, the input buffer 10 according to the first embodiment substantially performs only comparison of the voltage value of the input signal IN with the input threshold value of the comparator 111 and therefore it is possible to reduce a variation in input threshold value more than the case of the input buffer 60.

Second Embodiment

Figure 8:
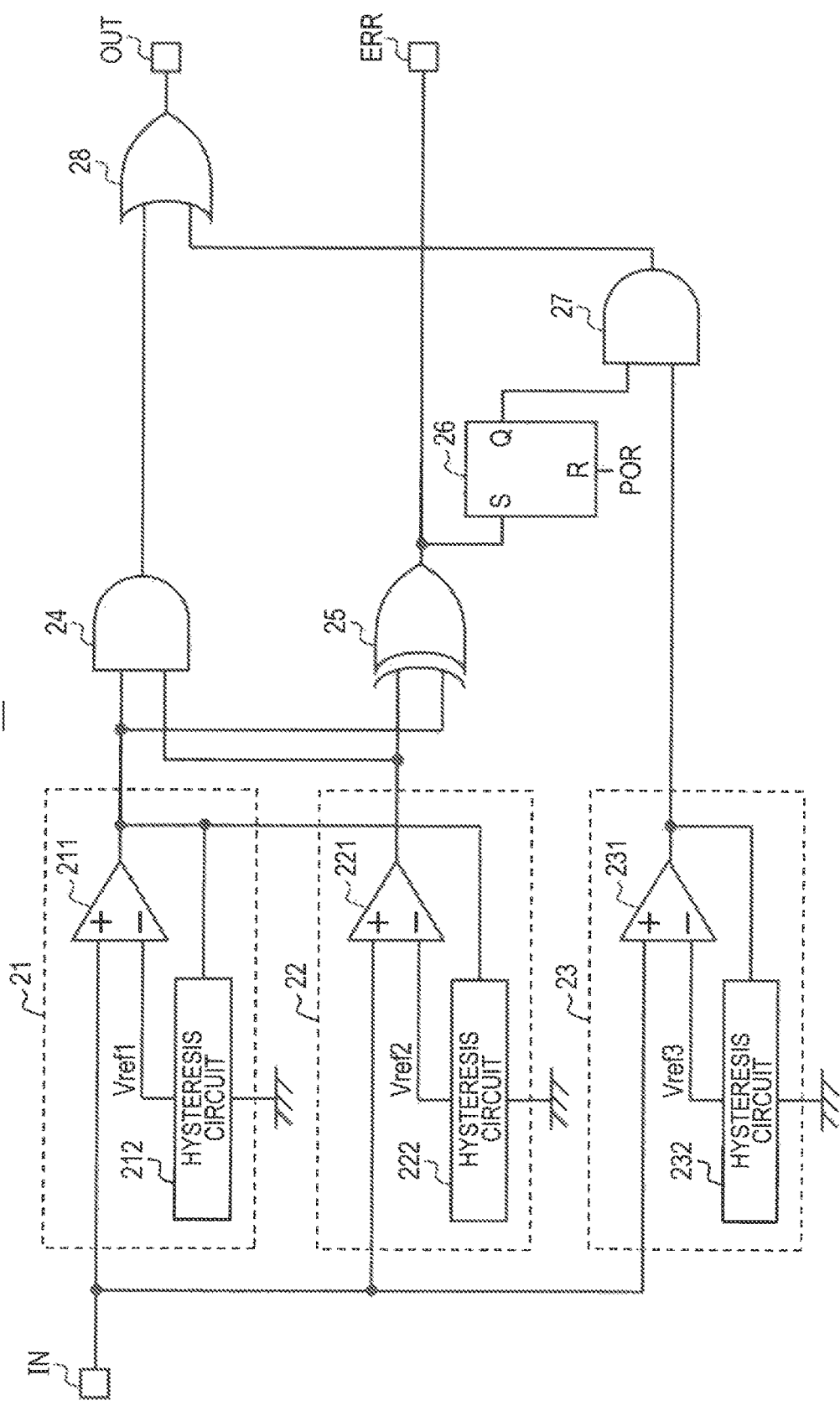
FIG. 8 is a diagram illustrating one configuration example of an input buffer according to a second embodiment.

FIG. 8 is a diagram illustrating one configuration example of an input buffer 20 according to the second embodiment. The input buffer 20 further includes a third comparison section in addition to the first and second comparison sections differently from the input buffer 10. In the following, description will be made specifically.

As illustrated in FIG. 8, the input buffer 20 includes a first comparison section 21, a second comparison section 22, a third comparison section 23, an AND circuit 24, an XOR circuit 25, an RS latch circuit 26, an AND circuit 27, a logical sum circuit (in the following, referred to as an OR circuit) 28 and so forth. The first comparison section 21 includes a comparator 211, a hysteresis circuit 212 and so forth. The second comparison section 22 includes a comparator 221, a hysteresis circuit 222 and so forth. The third comparison section 23 includes a comparator (a third comparator) 231, a hysteresis circuit (a third reference voltage generation section) 232 and so forth.

Incidentally, the first comparison section 21, the second comparison section 22, the AND circuit 24 and the XOR circuit 25 in the input buffer 20 respectively correspond to the first comparison section 11, the second comparison section 12, the AND circuit 14 and the XOR circuit 15 in the input buffer 10. In the following, contents of the input buffer 20 which are different from those of the input buffer 10 will be mainly described.

For example, the third comparison section 23 has the same circuit configuration as the first comparison section 21. Accordingly, the hysteresis circuit 232 of the third comparison section 23 generates a reference voltage Vref3 of a level which is substantially the same as that of the reference voltage Vref1 generated by the hysteresis circuit 212 of the first comparison section 21.

The AND circuit 24 outputs a logical product of the respective comparison results of the comparators 211 and 221. The XOR circuit 25 outputs an exclusive logical sum of the respective comparison results of the comparators 211 and 221. In the RS latch circuit 26, an output signal from the XOR circuit 25 is supplied to a set terminal S thereof, a power-on reset signal (a POR signal) is supplied to a reset terminal R thereof and an output signal is output from an output terminal Q thereof. The AND circuit 27 outputs a logical product of the output signal from the RS latch circuit 26 and the comparison result of the comparator 231 provided in the third comparison section 23. The OR circuit 28 outputs a logical sum of an output signal from the AND circuit 24 and an output signal from the AND circuit 27. An output signal from the OR circuit 28 is output to the outside via the output terminal OUT. In the following, the output signal from the OR circuit 28 will be also referred to as the output signal OUT.

In a case where both of the comparators 211 and 221 are in the normal states, the RS latch circuit 26 outputs a Lo level signal and outputs a Hi level signal after the fault has been detected in either the comparator 211 or the comparator 221. More specifically, when the power-on reset signal becomes active in a state where the fault detection signal ERR is at the Lo level, the RS latch circuit 26 outputs a Lo level signal and then when the fault detection signal ERR rises, the RS latch circuit 26 switches the level of the output signal from the Lo level to the Hi level.

For example, in a case where both of the comparators 211 and 221 are in the normal states, the output from the RS circuit 26 is at the Lo level and therefore the AND circuit 27 outputs the Lo level signal irrespective of the comparison result of the third comparison section 23. Accordingly, the OR circuit 28 outputs the output signal from the AND circuit 24 as the output signal OUT as it is. That is, in a case where both of the comparators 211 and 221 are in the normal states, the input buffer 20 operates in the same manner as the input buffer 10.

In contrast, in a case where either the comparator 211 or the comparator 221 has failed, the output from the RS latch circuit 26 is at the Hi level and therefore the AND circuit 27 outputs the comparison result of the third comparison section 23 as it is.

Here, in a case where the comparison result of the failed comparator is fixed to the Hi level, the output from the AND circuit 24 indicates the same value as that in the normal state. Therefore, the OR circuit 28 outputs a logical sum of the output from the AND circuit 24 which is the same as the output in the normal state and the output from the third comparison section 23 which is in normal operation as the output signal OUT. That is, the OR circuit 28 outputs the output signal OUT which is the same as that in the normal state.

On the other hand, in a case where the level of the comparison result of the failed comparator is fixed to the Lo level, the output from the AND circuit 24 is maintained at the Hi level differently from the output in the normal state. Therefore, the OR circuit 28 outputs the logical sum of the output from the AND circuit 24 which indicates the Lo level and the output from the third comparison section 23 which is in normal operation as the output signal OUT. That is, the OR circuit 28 outputs the output signal OUT which is the same as that in the normal state even in a case where the level of the comparison result of the failed comparator is fixed to the Lo level.

The input buffer 20 is able to realize not the failsafe operation but the same operation as that in the normal state in this way not only in a case where the comparison result of either the comparator 211 or the comparator 221 has been fixed to the Hi level but also in a case where the comparison result of either the comparator 211 or the comparator 221 has been fixed to the Lo level.

In addition, as a matter of course, even in a case where the third comparison 23 has failed, the input buffer 20 is able to perform the operation which is equivalent to the operation in the normal state as long as the first and second comparison sections 21 and 22 do not fail.

In addition, in a case where the comparison result of the comparator 211 in the first comparison section 21 has been fixed to the Hi level or the Lo level, the level of the reference voltage Vref2 of the hysteresis circuit 222 in the second comparison section 22 is fixed to a low voltage or a high voltage. However, in this case, the input buffer 20 is able to output the output signal OUT by using the comparison result of the third comparison section 23 instead of those of the first and second comparison sections 21 and 22 with no dissipation of hysteresis property.

Third Embodiment

Figure 9:
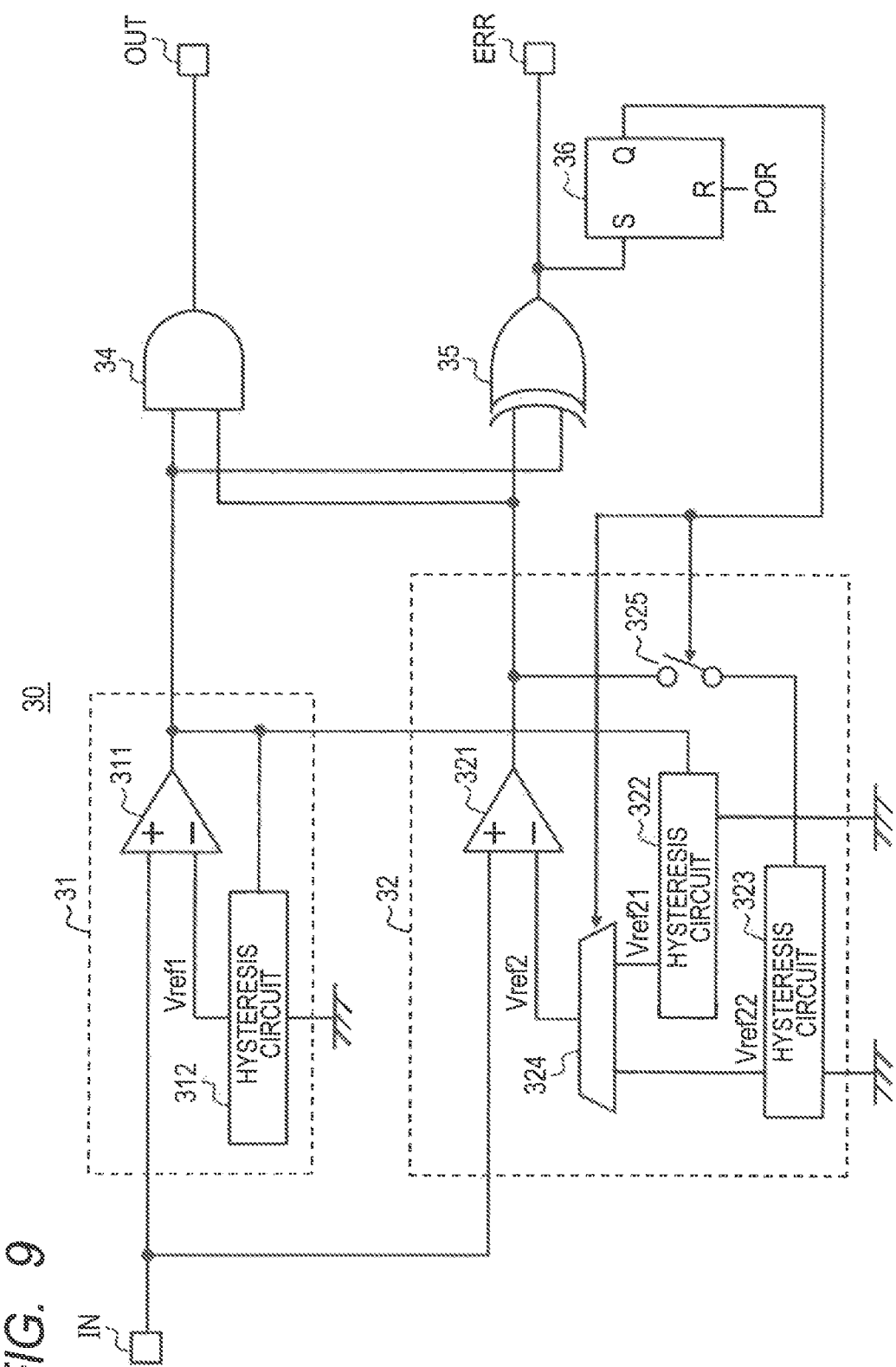
FIG. 9 is a diagram illustrating one configuration example of an input buffer according to a third embodiment.

FIG. 9 is a diagram illustrating one configuration example of an input buffer 30 according to the third embodiment. In the input buffer 30, the configuration of the second comparison section is different from that in the input buffer 10. In the following, description will be made specifically.

As illustrated in FIG. 9, the input buffer 30 includes a first comparison section 31, a second comparison section 32, an AND circuit 34, an XOR circuit 35, an RS latch circuit 36 and so forth. The first comparison section 31 includes a comparator 311, a hysteresis circuit 312 and so forth. The second comparison section 32 includes a comparator 321, a hysteresis circuit (a second reference voltage generation section) 322, a hysteresis circuit (a third reference voltage generation section) 323, a selection circuit 324, a switch 325 and so forth. The switch 325 may not be provided in the second comparison section 32.

Incidentally, the first comparison section 31, the second comparison section 32, the AND circuit 34 and the XOR circuit 35 in the input buffer 30 respectively correspond to the first comparison section 11, the second comparison section 12, the AND circuit 14 and the XOR circuit 15 in the input buffer 10. In the following, contents of the input buffer 30 which are different from those of the input buffer 10 will be mainly described.

In a case where both of the comparators 311 and 321 are in the normal states, the RS latch circuit 36 outputs the Lo level signal and then outputs the Hi level signal after the fault has been detected in either the comparator 311 or the comparator 321. More specifically, when the power-on signal becomes active in a state where the fault detection signal ERR is at the Lo level, the RS latch circuit 36 outputs the Lo level signal. Then, when the fault detection signal ERR rises, the RS latch circuit 36 switches the level of the output signal from the Lo level to the Hi level.

The comparator 321 compares the voltage of the input signal IN with the reference voltage Vref2 and outputs a comparison result. The hysteresis circuit 322 generates a high voltage side or low voltage side reference voltage Vref21 according to a comparison result of the comparator 311 provided in the first comparison unit 31. The hysteresis circuit 323 generates a high voltage side or low voltage side reference voltage Vref22 according to a comparison result of the comparator 321 provided in the second comparison section 32. In the following, the high voltage side reference voltage Vref21 will be also referred to as an input threshold value VIH21 and the low voltage side reference voltage Vref21 will be also referred as an input threshold value VIL21. In addition, the high voltage side reference voltage Vref22 will be also referred to as an input threshold value VIH22 and the low voltage side reference voltage Vref22 will be also referred as an input threshold value VIL22.

Here, the hysteresis circuits 312 and 322 are configured so as to meet VIH1<VIH21 and VIL1>VIL21 after the influence of the variation in manufacturing has been taken into consideration. In regard to this point, the hysteresis circuit 323 is configured such that VIH22 and VIL22 become almost equivalent to VIH1 and VIL1 of the hysteresis circuit 312 respectively.

The selection circuit 324 selects either the reference voltage Vref21 or the reference voltage Vref22 on the basis of a fault detection result and outputs the selected voltage as the reference voltage Vref2. The switch 325 is provided on a feedback path ranging from the comparator 321 to the hysteresis circuit 323 and performs on/off switching in accordance with the fault detection result.

For example, in a case where both of the comparators 311 and 321 are in the normal states, that is, the output from the RS latch circuit 36 is at the Lo level, the selection circuit 324 selects the reference voltage Vref21 generated by the hysteresis circuit 322 and outputs the selected reference voltage Vref21 as the reference voltage Vref2. In addition, the switch 325 is controlled to an off-state. In this case, the input buffer 30 performs the operation equivalent to the operation that the input buffer 10 performs in the normal state.

In addition, for example, in a case where the level of the output from the RS latch circuit 36 is switched to the Hi level due to the fault of the comparator 311, the selection circuit 324 selects the reference voltage Vref22 generated by the hysteresis circuit 323 and outputs the selected reference voltage Vref22 as the reference voltage Vref2. In addition the switch 325 is controlled to an on-state. In this case, the comparator 321 which is in the normal state performs a comparing operation by using the reference voltage Vref22 generated on the basis of its own comparison result in place of use of the reference voltage Vref21 generated on the basis of the comparison result of the failed comparator 311. Accordingly, the input buffer 30 is able to output the output signal OUT with no dissipation of the hysteresis property.

Incidentally, also in a case where the level of the output from the RS latch circuit 36 is switched to the Hi level due to the fault of the comparator 321, the selection circuit 324 selects the reference voltage Vref22 generated by the hysteresis circuit 323 and outputs the selected reference voltage Vref22 as the reference voltage Vref2 and the switch 325 is controlled to the on-state. However, in any case, the level of the output from the failed comparator 321 is still in a state of being fixed to the Hi level or the Lo level. In this case, the input buffer 30 performs the operation equivalent to the operation that the input buffer 10 performs in occurrence of the fault.

In the input buffer 30, in a case where the fault has occurred, the comparator 321 performs the comparing operation by using the reference voltage Vref22 generated on the basis of its own comparison result in place of use of the reference voltage Vref21 generated on the basis of the comparison result of the comparator 311. Thereby, even in a case where the comparison result of the comparator 311 has been fixed to the Hi level or the Lo level caused by occurrence of the fault, the input buffer 30 is able to output the output signal OUT with no dissipation of the hysteresis property.

Fourth Embodiment

Figure 10:
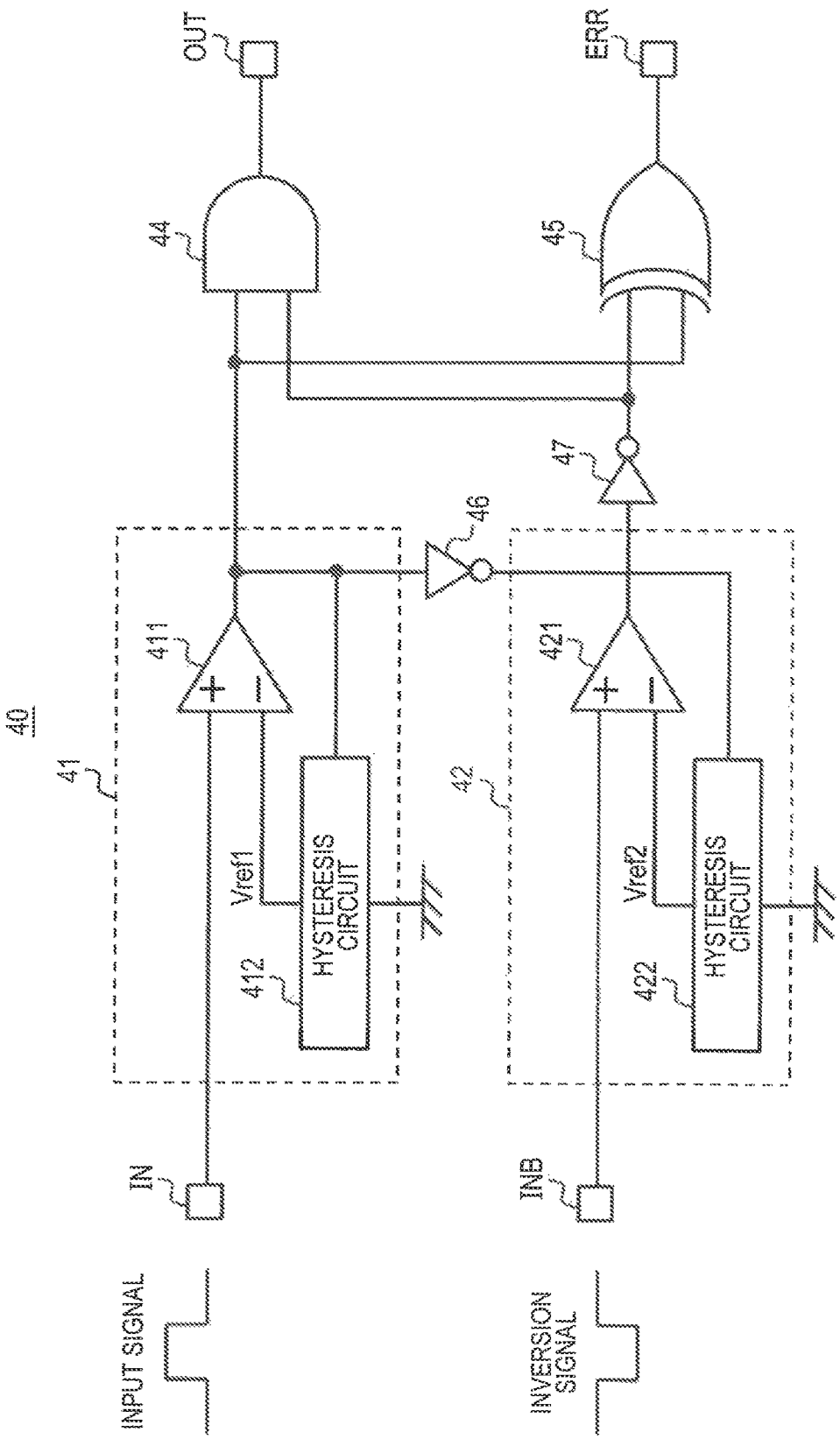
FIG. 10 is a diagram illustrating one configuration example of an input buffer according to a fourth embodiment.

FIG. 10 is a diagram illustrating one configuration example of an input buffer 40 according to the fourth embodiment. In the input buffer 10, both of the two comparison sections perform the comparing operations on the input signal IN. On the other hand, in the input buffer 40, one comparison section performs the comparing operation on the input signal IN and the other comparison section performs the comparing operation on an inversion signal of the input signal IN. In the following, description will be made specifically.

As illustrated in FIG. 10, the input buffer 40 includes a first comparison section 41, a second comparison section 42, an AND circuit 44, an XOR circuit 45, inverters 46 and 47 and so forth. The first comparison section 41 includes a comparator 411, a hysteresis circuit 412 and so forth. The second comparison section 42 includes a comparator 421, a hysteresis circuit 422 and so forth.

Incidentally, the first comparison section 41, the second comparison section 42, the AND circuit 44 and the XOR circuit 45 in the input buffer 40 respectively correspond to the first comparison section 11, the second comparison section 12, the AND circuit 14 and the XOR circuit 15 in the input buffer 10. In the following, contents of the input buffer 40 which are different from those of the input buffer 10 will be mainly described.

In the second comparison section 42, the comparator 421 compares a voltage of an input signal INB which is supplied to an input terminal INB from the outside with the reference voltage Vref2 and outputs a comparison result. Incidentally, the input signal INB is an inversion signal of the input signal IN. The hysteresis circuit 422 generates the high voltage side or low voltage side reference voltage Vref2 according to a signal obtained by inverting the comparison result of the comparator 411 provided in the first comparison section 41 by the inverter 46.

The AND circuit 44 outputs a logical product of the comparison result of the comparator 411 and the signal obtained by inverting the comparison result of the comparator 421 as the output signal OUT. The XOR circuit 45 outputs a logical product of the comparison result of the comparator 411 and a signal obtained by inverting the comparison result of the comparator 421 by the inverter 47 as the output signal OUT.

Other configurations of the input buffer 40 are the same as those of the input buffer 10 and therefore description thereof is omitted.

Here, in the normal state, the input signal and the output signal of the second comparison unit 42 are signals obtained by inverting the input signal and the output signal of the first comparison section 41 respectively. Accordingly, in the normal state, the signal obtained by inverting the comparison result of the second comparison section 42 by the inverter 47 indicates a value which is the same as that of the comparison result of the second comparison section 12 of the input buffer 10.

Thereby, it becomes possible for the input buffer 40 to detect also a fault/faults in a transmission path between the semiconductor-microcomputer 101 and the input buffer 40 (for example, a short-circuit/short-circuits to a transmission path between VDD and GND and/or a transmission path which is adjacent thereto), faults of the ESD protection elements (for example, the short-circuits to VDD and GND) provided for the input terminals IN and INB of the input buffer 40 and so forth, not limited to the faults of the comparators 411 and 421.

As described above, each of the input buffers according to the above-mentioned first to fourth embodiments includes the two comparison sections one of which compares the voltage of the input signal IN (or the inversion signal INB thereof) with one reference voltage and the other of which compares the voltage of the input signal IN (or the inversion signal INB thereof) with the other reference voltage and switches the reference voltage levels (the input threshold values) of the two comparison sections on the basis of the comparison result of the main comparison section. Here, each of the input buffers according to the above-mentioned first to fourth embodiments is configured such that the high voltage side reference voltage of the main comparison unit becomes lower than the high voltage side reference voltage of the sub comparison section and is configured such that the low voltage side reference voltage of the main comparison section becomes higher than the low voltage side reference voltage of the sub comparison section. Thereby, in a case where the voltage level of the input signal IN has been shifted, the voltage of the input signal IN typically reaches the input threshold value of the main comparison section earlier than it reaches the input threshold value of the sub comparison section and therefore the comparison result of the main comparison section is switched earlier than the comparison result of the sub comparison section is switched. When the comparison result of the main comparison section is switched, the levels (the input reference values) of the respective reference voltages of the two comparison sections are switched all at once and thereby also the comparison result of the sub comparison section is switched together with switching of the comparison result of the main comparison section.

Thereby, each of the input buffers according to the above-mentioned first to fourth embodiments is able to perform fault diagnosis in real time with no misdetection of the fault even in a case where the respective input threshold values of the two comparison sections deviate from the ideal values under the influence of the variation in manufacturing.

Incidentally, as a matter of course, each of the input buffers according to the above-mentioned first to fourth embodiments is able to realize the same operation as that in the normal state or, at least, to realize the failsafe operation even in a case where either one of the two comparison sections has failed. From the foregoing, the electric power control semiconductor device which is provided with the input buffer and the engine control unit which is provided with the above-mentioned electric power control semiconductor device are able to accurately control driving of the electric parking brake.

Although the invention which has been made by the inventors and others has been specifically described on the basis of the embodiments thereof as mentioned above, it goes without saying that the present invention is not limited to the above-mentioned embodiments and may be altered and modified in a variety of ways within a range not deviating from the gist of the present invention.

For example, the semiconductor device according to each of the above-mentioned embodiments may be also configured so as to invert the conductivity type (the p-type or the n-type) of each of a semiconductor substrate, a semiconductor layer, a diffusion layer (a diffusion region) and so forth. Therefore, in a case where one of the conductivity types, that is, one of the n-type and the p-type is defined as a first conductivity type and the other conductivity type is defined as a second conductivity type, the first conductivity type may be defined as the p-type and the second conductivity type may be defined as the n-type, and the first conductivity type may be defined as the n-type and the second conductivity type may be defined as the p-type inversely.

What is claimed is:

1. An input buffer comprising:
a first comparator which compares a voltage of an input signal with a first reference voltage and outputs a first comparison result;
a first reference voltage generation section which selects either a first high potential side voltage or a first low potential side voltage on the basis of the first comparison result and outputs the selected voltage as the first reference voltage;
a second comparator which compares the voltage of the input signal with a second reference voltage and outputs a second comparison result;
a second reference voltage generation section which selects either a second high potential side voltage which is higher than the first high potential side voltage or a second low potential side voltage which is lower than the first low potential side voltage and outputs the selected voltage as the second reference voltage;
an output signal ration section which generates an output signal on the basis of the first and second comparison results;
a fault detection signal generation section which generates a fault detection signal indicating whether a fault has occurred in either the first comparator or the second comparator on the basis of the first and second comparison, results;
a third comparator which compares the voltage of the input signal with a third reference voltage and outputs a third comparison result; and
a third reference voltage generation section which selects either a third high potential side voltage or a third low potential side voltage on the basis of the third comparison result and outputs the selected voltage as the third reference voltage, wherein in a case where it is detected that the fault has occurred in either the first comparator or the second comparator, the output signal generation section generates the third comparison result as the output signal, wherein the third high potential side voltage indicates a voltage level which is substantially the same as that of the first high potential side voltage, and wherein the third low potential side voltage indicates a voltage level which is substantially the same as that of the first low potential side voltage.

2. The input buffer according to claim 1, wherein the output signal generation unit includes a first AND circuit which outputs a logical product of the first comparison result and the second comparison result, an XOR circuit which outputs an exclusive logical sum of the first comparison result and the second comparison result, an RS latch circuit into a set terminal of which an output from the XOR circuit is input and into a reset terminal of which a reset signal is input, a second AND circuit which outputs a logical product of an output from the RS latch circuit and the third comparison result, and an OR circuit which outputs a logical sum of outputs from the first AND circuit and the second AND circuit as the output signal, and wherein the fault detection signal generation section is configured by the XOR circuit and outputs an output from the XOR circuit as the fault detection signal.

3. An input buffer comprising:

a first comparator which compares a voltage of an input signal, with a first reference voltage and outputs a first comparison result;

a first reference voltage generation section which selects either a first high potential side voltage or a first low potential side voltage on the basis of the first comparison result and outputs the selected voltage as the first reference voltage;

a second comparator which compares the voltage of the input signal with a second reference voltage and outputs a second comparison result;

a second reference voltage generation section which selects either a second high potential side voltage which is higher than the first high potential side voltage or a second low potential side voltage which is lower than the first low potential side voltage and outputs the selected voltage as the second reference voltage;

an output signal generation section which generates an output signal on the basis of the first and second comparison results;

a fault detection signal generation section which generates a fault detection signal indicating whether a fault has occurred in either the first comparator or the second comparator on the basis of the first and second comparison results;

a third reference voltage generation section which selects either the third high potential side voltage or the third low potential side voltage on the basis of the second comparison result and outputs the selected voltage as a third reference voltage; and a selection circuit which, in a case where it is detected that the fault has occurred in either the first comparator or the second comparator, switches the voltage to be selected from the second reference voltage to the third reference voltage and outputs the selected third reference voltage as a new second reference voltage, wherein the second comparator compares the voltage of the input signal with the new second reference voltage output from the selection circuit and outputs the second comparison result.

4. The input buffer according to claim 3, wherein the third high potential side voltage indicates a voltage level which is substantially the same as the voltage level of the first high potential side voltage, and wherein the third low potential side voltage indicates a voltage level which is substantially the same as the voltage level of the first low potential side voltage.

5. The input buffer according to claim 3, further comprising:

an RS latch circuit into a set terminal of which the fault detection signal is input and into a reset terminal of which a reset signal is input, wherein the output signal generation section includes a first AND circuit which outputs a logical product of the first comparison result and the second comparison result as the output signal, wherein the fault detection signal generation section includes an XOR circuit which outputs an exclusive logical sum of the first comparison result and the second comparison result as the fault detection signal, and wherein the selection circuit selects either the second reference voltage or the third reference voltage on the basis of an output from the RS latch and outputs the selected reference voltage as a new second reference voltage.

6. An input buffer comprising:

a first comparator which compares a voltage of an input signal with a first reference voltage, and outputs a first comparison result;

a first reference voltage generation section which selects either a first high potential side voltage or a first low potential side voltage on the basis of the first comparison result and outputs the selected voltage as the first reference voltage;

a second comparator which compares the voltage of the input signal with a second reference voltage and outputs a second comparison result;

a second reference voltage generation section which selects either a second high potential side voltage which is higher than the first high potential side voltage or a second low potential side voltage which is lower than the first low potential side voltage and outputs the selected voltage as the second reference voltage;

an output signal generation section which generates an output signal on the basis of the first and second comparison results; and a fault detection signal generation section which generates a fault detection signal indicating whether a fault has occurred in either the first comparator or the second comparator on the basis of the first and second comparison results;

wherein the second comparator compares a voltage of an inversion signal of the input signal with the second reference voltage and outputs the second comparison result, wherein the second reference voltage generation section selects either the second high potential side voltage or the second low potential side voltage on the basis of an inversion signal of the first comparison result and outputs the selected voltage as the second reference voltage, wherein the output signal generation section generates the output signal on the basis of the first comparison result and an inversion signal of the second comparison result, and wherein the fault detection signal generation section generates the fault detection signal on the basis of the first comparison result and the inversion signal of the second comparison result.

* * * * *